(12) United States Patent
Nemoto et al.

(10) Patent No.: US 7,049,674 B2
(45) Date of Patent: May 23, 2006

(54) REVERSE BLOCKING SEMICONDUCTOR DEVICE AND A METHOD FOR MANUFACTURING THE SAME

(75) Inventors: Michio Nemoto, Nagano (JP); Manabu Takei, Nagano (JP); Tatsuya Naito, Nagano (JP)

(73) Assignee: Fuji Electric Holdings Co., Ltd. (JP)

( * ) Notice: Subject to any disclaimer, the term of this patent is extended or adjusted under 35 U.S.C. 154(b) by 0 days.

(21) Appl. No.: 10/822,643

(22) Filed: Apr. 12, 2004

(65) Prior Publication Data

US 2004/0256691 A1    Dec. 23, 2004

(30) Foreign Application Priority Data

| Apr. 10, 2003 | (JP) | ............................. 2003-106734 |
| Nov. 27, 2003 | (JP) | ............................. 2003-396580 |
| Feb. 3, 2004 | (JP) | ............................. 2004-027175 |

(51) Int. Cl.
*H01L 21/8238* (2006.01)
*H01L 29/76* (2006.01)

(52) U.S. Cl. ...................... 257/491; 257/492; 257/327; 257/329

(58) Field of Classification Search ........ 257/491–492, 257/327, 329
See application file for complete search history.

(56) References Cited

U.S. PATENT DOCUMENTS 4,743,952 A * 5/1988 Baliga ........................ 257/342

(Continued)

FOREIGN PATENT DOCUMENTS

| JP | 3-48462 | * | 3/1991 |
| JP | 6-97469 A | | 4/1994 |

(Continued)

OTHER PUBLICATIONS

"600V-IGBT with Reverse Blocking Capability"; Takei et al.; Proceedings of 2001 International Symposium on Power Semiconductor Devices & ICs, Osaka, Japan; pp. 413-416.

*Primary Examiner*—Nathan J. Flynn
*Assistant Examiner*—Ahmed N. Sefer
(74) *Attorney, Agent, or Firm*—Rossi, Kimms & McDowell, LLP

(57) ABSTRACT

A reverse blocking semiconductor device that shows no adverse effect of an isolation region on reverse recovery peak current, that has a breakdown withstanding structure exhibiting satisfactory soft recovery, that suppresses aggravation of reverse leakage current, which essentially accompanies a conventional reverse blocking IGBT, and that retains satisfactorily low on-state voltage is disclosed. The device includes a MOS gate structure formed on a n– drift layer, the MOS gate structure including a p+ base layer formed in a front surface region of the drift layer, an n+ emitter region formed in a surface region of the base layer, a gate insulation film covering a surface area of the base layer between the emitter region and the drift layer, and a gate electrode formed on the gate insulation film. An emitter electrode is in contact with both the emitter region and the base layer of the MOS gate structure. A p+ isolation region surrounds the MOS gate structure through the drift layer and extends across whole thickness of the drift layer. A p+ collector layer is formed on a rear surface of the drift layer and connects to a rear side of the isolation region. A distance W is greater than a thickness d, in which the distance W is a distance from an outermost position of a portion of the emitter electrode, the portion being in contact with the base layer, to an innermost position of the isolation region, and the thickness d is a dimension in a depth direction of the drift layer.

6 Claims, 26 Drawing Sheets

U.S. PATENT DOCUMENTS

| | | | |
|---|---|---|---|
| 5,463,231 A * | 10/1995 | Ogura et al. | 257/138 |
| 5,608,237 A | 3/1997 | Aizawa et al. | 257/132 |
| 5,698,454 A | 12/1997 | Zommer | 437/6 |
| 5,973,338 A * | 10/1999 | Okabe et al. | 257/133 |
| 6,091,086 A | 7/2000 | Zommer | 247/121 |
| 2003/0057478 A1 * | 3/2003 | Yun et al. | 257/328 |
| 2003/0080377 A1 * | 5/2003 | Yedinak et al. | 257/328 |

FOREIGN PATENT DOCUMENTS

| | | |
|---|---|---|
| JP | 7-307469 A | 11/1995 |
| JP | 2001-185727 A | 7/2001 |
| JP | 2002-76017 A | 3/2002 |
| JP | 2002-319676 | * 10/2002 |
| JP | 2002-319676 A | 10/2002 |
| JP | 2002-353454 A | 12/2002 |

* cited by examiner

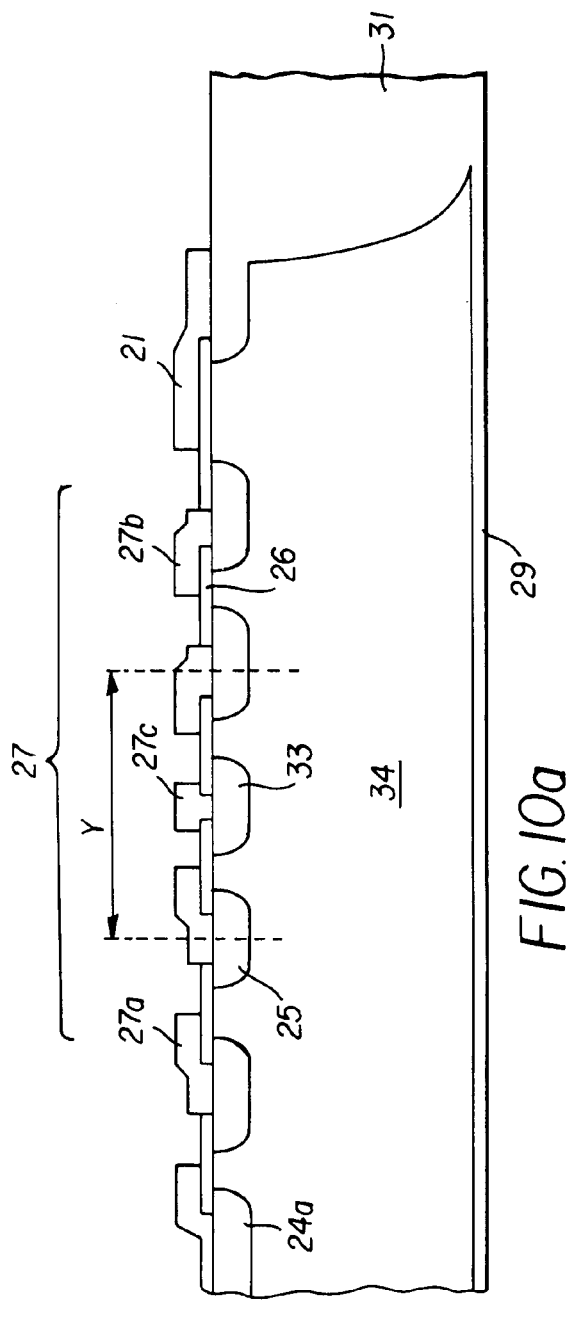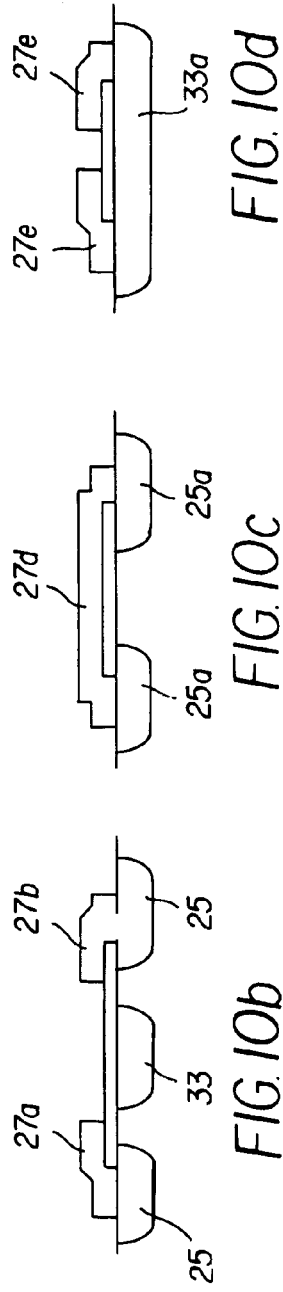

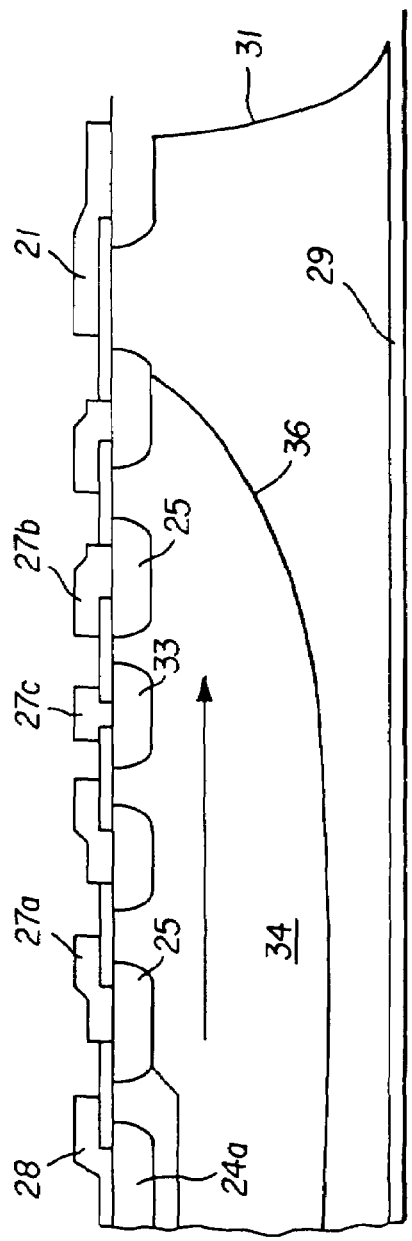
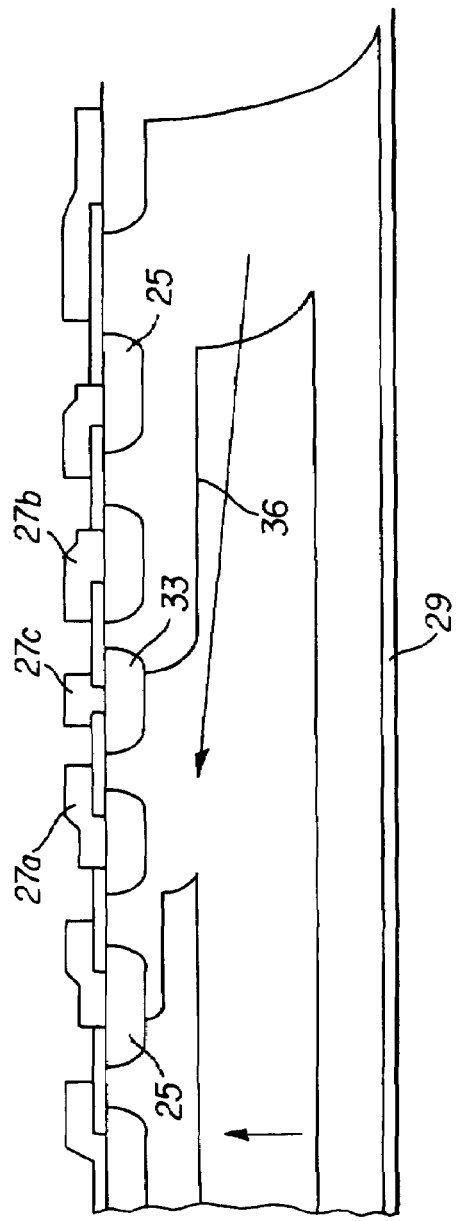
FIG. 11a
FIG. 11b

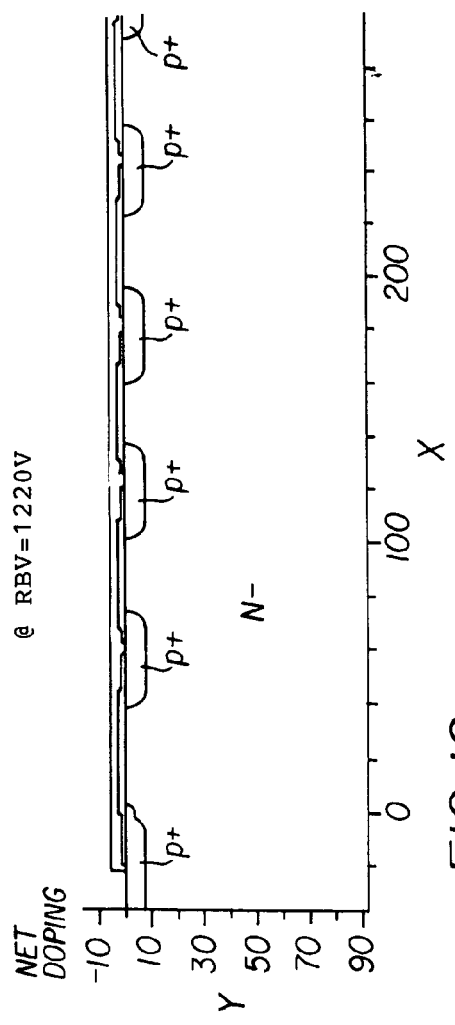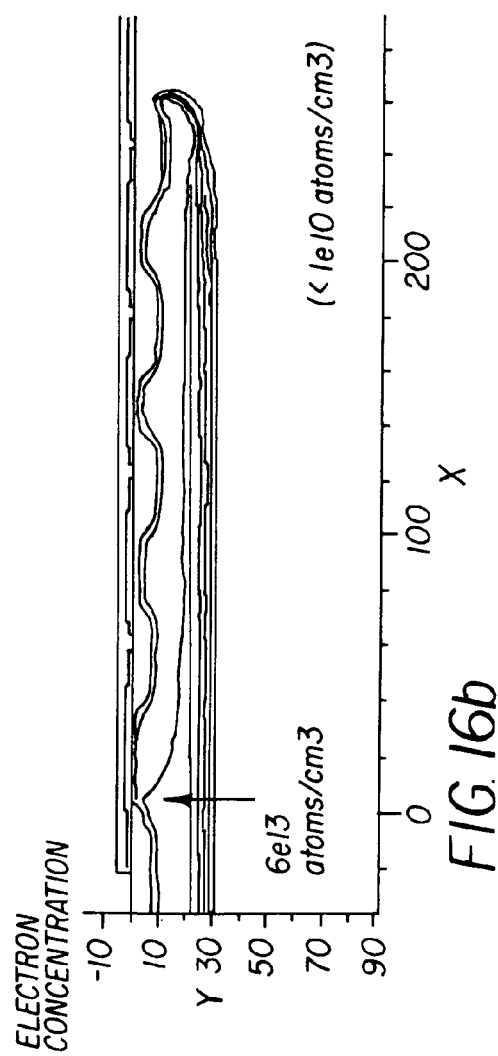

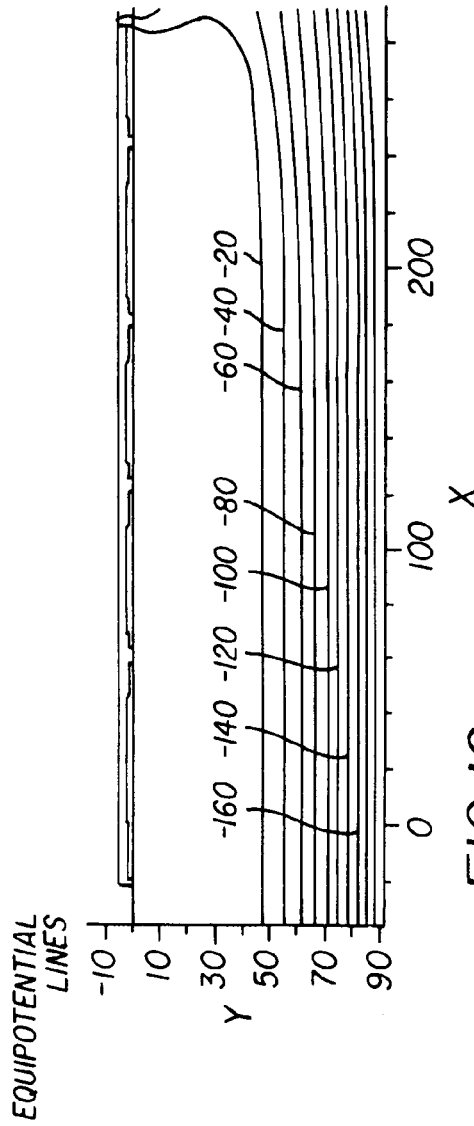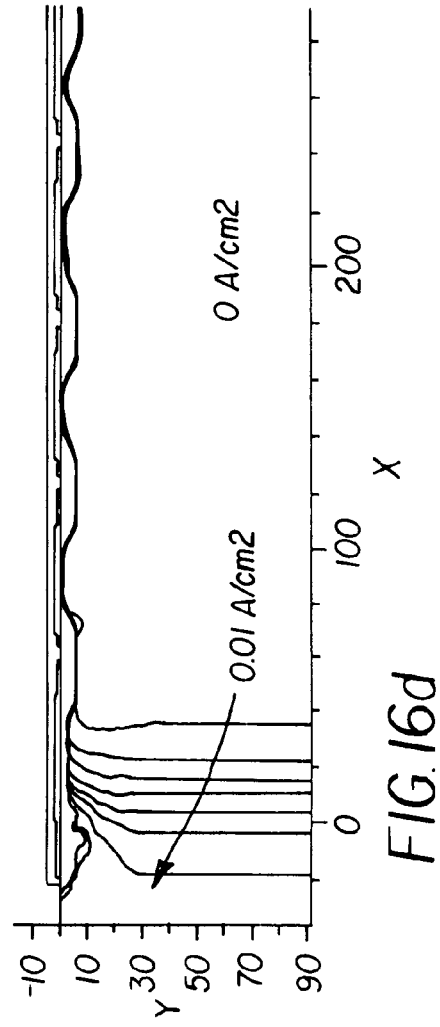

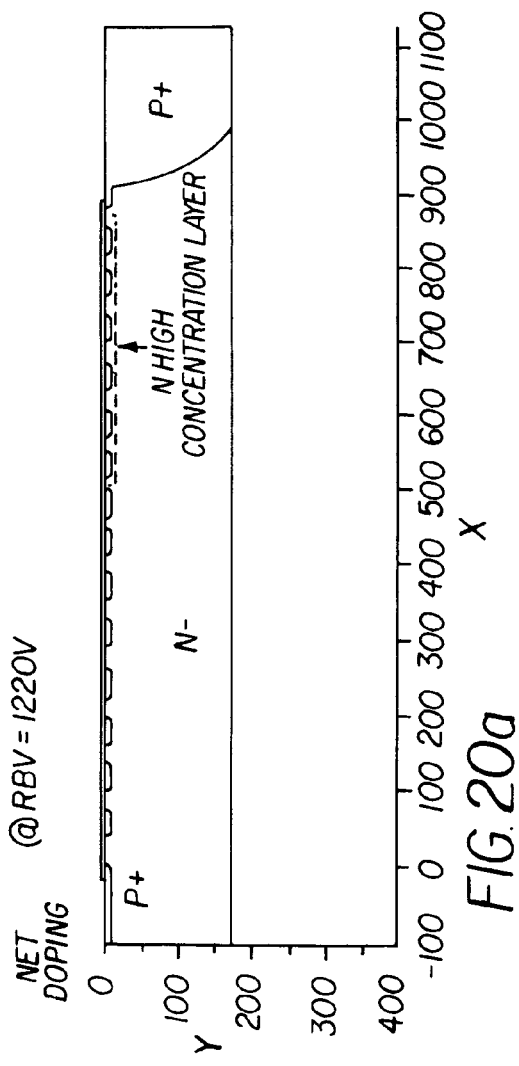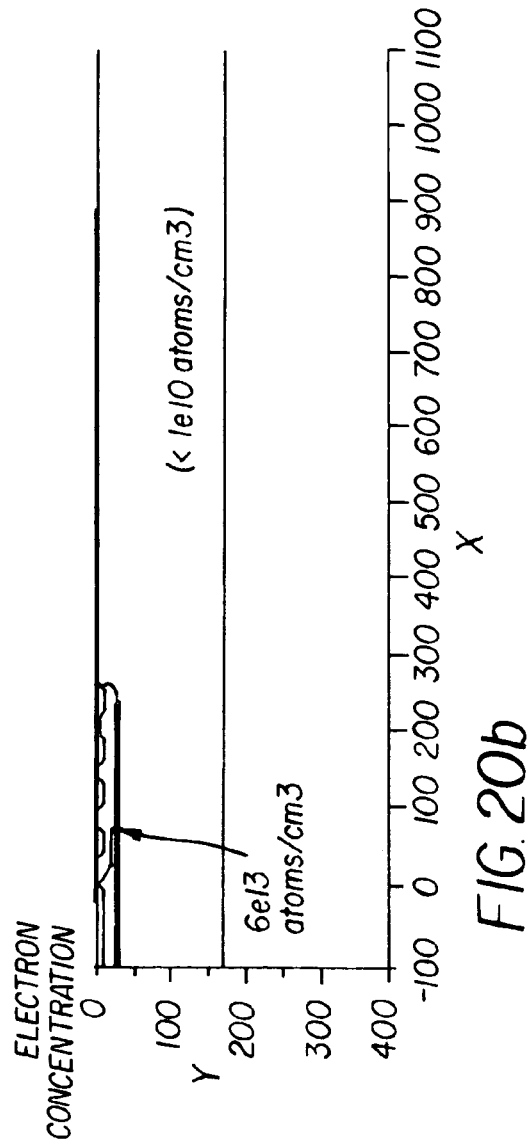
FIG. 20a
FIG. 20b

REVERSE BLOCKING SEMICONDUCTOR DEVICE AND A METHOD FOR MANUFACTURING THE SAME

BACKGROUND OF THE INVENTION

A. Field of the Invention

The present invention relates to power semiconductor devices for use in power converters, in particular to IGBTs that are made using an FZ (floating zone) wafer and have bidirectional withstand capability, called bidirectional IGBTs or reverse blocking IGBTs.

B. Description of the Related Art

Conventional IGBTs (insulated gate bipolar transistors) that have a planar pn junction structure are used with a dc (direct current) power supply in their main application field of inverter circuits or chopper circuits. Since no problems occur in such application fields as long as a forward breakdown voltage is secured, obtaining reverse withstand capability has not been considered an important factor in designing and manufacturing such IGBTs.

In recent years, however, matrix converters such as a directly linked conversion circuit are being employed in semiconductor converter systems to execute an ac (alternating current) to ac conversion, an ac to dc conversion, or a dc to ac conversion. The use of bidirectional switching elements in the matrix converter for the purpose of miniaturization, reduction of weight, high efficiency, fast response, and low cost of the circuit has been studied. Therefore, IGBTs having reverse blocking capability are required in order to obtain a bidirectional switching element consisting of anti-parallel connected reverse blocking IGBTs.

FIGS. 25(a), (b), and (c) show a matrix converter circuit. FIG. 25(a) shows the circuit including the switching elements for three phases. FIG. 25(b) shows one switching element using ordinary IGBTs, while FIG. 25(c) shows a switching element using bidirectional IGBTs having bidirectional withstand capability. Conventional IGBTs 1a, 1b in the converter circuit as shown in FIG. 25(b) need diodes 2a, 2b series-connected and in the forward direction connecting to the IGBTs to secure reverse breakdown voltage because the IGBTs were not designed and produced for obtaining effective reverse blocking capability. The series-connected diodes generate large losses resulting in low conversion efficiency of the converter. Large number of device elements causes difficulties in achieving small size, light weight, and low cost of the converter. Reverse blocking IGBTs 1c and 1d as shown in FIG. 25(c) can eliminate the series-connected diodes.

FIGS. 24(a) and (b) are sectional views of an essential part of a reverse blocking IGBT. FIG. 24(a) shows the cross section when a reverse voltage is applied and FIG. 24(b) shows the cross section when a forward voltage is applied. In FIGS. 24(a) and (b), a deep p+ type isolation region 11 is formed by diffusion from front and rear surfaces of an n type FZ wafer that serves as an n− drift layer 3. Then, MOS gate structures are formed comprising a plurality of p+ base layers selectively formed in the front surface region of the n− drift layer 3, n+ emitter region 5 selectively formed in the surface region of each of the p+ base layers 4, gate oxide films 6, gate electrodes 7, and an emitter electrode 8. After the formation of the MOS gate structure, a thickness of the n− type drift layer 3 is reduced to about 100 μm in the case of reverse withstand voltage of 600 V by removing the rear portion of the drift layer. After the thickness reduction, a p+ collector layer 9 is formed by ion implantation from the rear surface and following annealing. Thus produced IGBT device is surrounded by the heavily doped p+ isolation region 11 around the side face of the device at the dicing position 10. Consequently, a depletion layer 12 on application of a reverse voltage only extends towards the vicinity of the pn junction at the p+ collector layer 9 and the p+ isolation region 11 and does not appear at the side face of the device at the dicing position. Thus, an electric field develops only on the front surface of the device. Therefore, a sufficient reverse breakdown voltage can be attained. (See Japanese Unexamined Patent Application Publication Nos. H07-307469, 2001-185727, 2002-076017, and 2002-353454 and M. Takei et al., Proceedings of 2001 International Symposium on Power Semiconductor Devices and ICs, 2001, Osaka, Japan, pages 413–416, "600 V-IGBT with Reverse Blocking Capability".) If a conventional IGBT that lacks this p+ isolation region 11 is reversely biased with an emitter at a ground potential and a collector at a negative potential, electric field concentration occurs at a substrate end region of a p+ collector layer, resulting in increased leakage current and insufficient reverse breakdown voltage.

Antiparallel connection as in FIG. 25(c) of the devices of FIGS. 24(a) and (b) make it possible to control forward and reverse current and to withstand application of forward and reverse voltages. Thus, the device of FIGS. 24(a) and (b) can be operated as a bidirectional device. Application of such bidirectional devices to an ac to ac converter allows direct conversion from ac to ac. Size of a converter circuit is drastically reduced as compared with a converter consisting of a converter, a capacitor, and an inverter. Consequently, the cost is substantially reduced. The bidirectional device operates as an IGBT and a free wheeling diode (FWD).

At the time of reverse recovery in the FWD operation, accumulated excess carriers are swept out by a depletion layer extending from the collector side. If the quantity of the carriers in the collector side is large, reverse recovery peak current becomes large, which is hard recovery behavior. For a reverse blocking IGBT to use as a FWD, improvement of the reverse recovery performance is essential. A method for improving the reverse recovery performance is known in which a collector layer in the rear side is formed by low temperature activation and with a low concentration (See Japanese Unexamined Patent Application Publication No.2002-353454).

FIG. 26 is a sectional view showing a peripheral breakdown withstanding structure of an IGBT. (See Japanese Unexamined Patent Application Publication No.2000-208768). Referring to FIG. 26, in a front surface region of n− drift layer 23 formed are p+ base layer 24 of a MOS gate structure, and p type field limit layers 25 and n type channel stopper layer 22 that are parts of a peripheral breakdown withstanding structure. Each field limit layer 25 is in contact with respective field limit electrode 27, which extends over oxide films 26 between field limit layers 25. Channel stopper layer 22 is in contact with channel stopper electrode 21, which extends in the direction toward emitter electrode 28. P+ collector layer 29 is formed in another surface region of n− drift layer 23.

A peripheral breakdown withstanding structure of usual IGBTs and FWDs is constructed so that the breakdown voltage is higher at the forward bias in which a collector electrode is at a positive potential and an emitter electrode is at a negative potential. Specific breakdown withstanding structures known in the art include a field limit layer, a field limit electrode, a combination of a field limit layer and a field limit electrode, SIPOS, and RESURF. A structure of the combination of a field limit and a field limit electrode is disclosed in Japanese Unexamined Patent Application Publication No.2000-208768. The structure is advantageous to obtain stable long term reliability. Generally, in a high humidity environment, when negative ions enter the surface region of the oxide film of the breakdown withstanding structure, positive charges are induced on the semiconductor surface beneath the oxide film, causing a lack of uniformity in electric field distribution, thereby decreasing breakdown voltage. The structure of the Japanese Unexamined Patent Application Publication No.2000-208768 facilitates a structure that has relatively narrow distances between the field limit layers and relatively long field limit electrodes in the region near the principal junction, which is a pn junction between the n− drift layer and the p layer in contact with the emitter electrode. The structure decreases openings between the field limit electrodes where the oxide film is exposed and inhibits invasion of the negative ions. Therefore, the adverse effect of the negative ions can be prevented.

However, distribution of equipotential lines in such a combination of field limit layer 25 and field limit electrode 27 is sensitive to the arrangement of lengths, depths, and intervals of the layers and the electrodes. For uniform distribution of electric potential and electric field strength shared by each field limit layer 25, generally the distances between field limit layers 25 must be made relatively narrow in the side of emitter electrode 28 and gradually widen towards the periphery of the element. The distances between field limit layers 25 in the region nearest to emitter electrode 28, in particular, are such that joining of built-in depletion layers at zero volt bias occurs between the adjacent p layers, which is the principal junction of the field limit layer. The distance between outermost field limit layer 25 and channel stopper layer 22 is set to be 162 μm for a 1,200 volt device that is about the diffusion length of minority carriers so that a depletion layer does not reach channel stopper layer 22. As a result, the length of the breakdown withstanding structure of the 1,200 V device is designed to be 708 μm to obtain a stable breakdown withstanding structure with little effect of surface charges.

A resistive film also has been used to achieve forward and reverse blocking characteristics. The technique uses a resistive nitride film formed on the oxide film in the breakdown withstanding structure. A minute amount of electric current flows in the resistive nitride film to attain uniform electric potential distribution and to enhance a breakdown voltage. This technique can be used in both forward and reverse directions in a reverse blocking IGBT in particular, eliminating a field limit layer and a field plate electrode. Consequently, a length of a breakdown withstanding structure comprising a resistive film can be made shorter than that of the field limit structure comprising a field limit layer and a field plate electrode. Unfortunately, a THB test (temperature humidity biased test), which is a kind of long term reliability test, demonstrated degradation of reverse blocking capability. The THB test examined long term variation of reverse blocking capability by placing a reverse blocking IGBT module in a high temperature and humidity environment of 85% RH and 125° C. and applying reverse bias voltage of 80% of the rated voltage. This degradation can be attributed to the resistive property of the nitride film that causes corrosion in the environment. The corrosion makes electric potential distribution not uniform causing an electric field concentration that degrades the blocking performance. Therefore, it is urgently required to devise a breakdown withstanding structure of a reverse blocking IGBT that performs satisfactory long term reliability.

It has been revealed that diode operation performance of the IGBT disclosed in Japanese Unexamined Patent Application Publication No.2002-353454 cited above is not improved even if the rear collector layer is made low injection because holes are also injected from the heavily doped p+ isolation region in the diode operation. Therefore, a structure is needed that suppresses hole injection from the p+ isolation layer.

Moreover, leakage current in the reverse biased condition, in which the emitter is positive and the collector is negative as shown in FIG. 24($a$), depends on emitter injection efficiency, which is a parameter to determine an open base amplification factor of the pnp transistor. The emitter injection efficiency is substantially determined by a p+ layer (not shown in FIGS. 24($a$) and ($b$)) formed in the surface region in the p+ base layer between n+ emitter regions 5,5, the p+ layer being in contact with the emitter electrode. The p+ layer is deeper than n+ emitter region 5 and shallower than p+ base layer 4, and is doped more heavily than p+ base layer 4. Since the p+ layer is extremely heavily doped, in an amount which can be more than $1 \times 10^{19}$ cm$^{-3}$, in order to prevent latch-up, emitter injection efficiency may be higher than 0.9. As a result, the leakage current at high temperature is more than 10 mA/cm$^2$, which is about 100 times greater than is typical. The emitter injection efficiency can be decreased by forming an n+ layer doped more heavily than n− drift layer 3 under p+ base layer 4. The n+ layer has a depth covering p+ base layer 4 in the case of a planar type, while the n+ layer is disposed between p+ base layer 4 and n− drift layer 3 in the case of a trench type. The n+ layer in the case of the planar type, however, produces a rigorous decrease in electric field intensity during off-operation, deteriorating blocking performance. Therefore, a means is needed that reduces the reverse leakage current more readily.

Since thickness of an oxide film that is a diffusion mask for forming a p+ isolation region is not great enough according to conventional technology, boron atoms eventually penetrate through the oxide film in high temperature diffusion around 1,250° C. forming a p+ layer even under the oxide film. This situation hinders formation of a normal MOS structure and an abnormal chip of IGBT may be formed that will not turn-on.

IGBTs that have reverse blocking capability must withstand high voltage in a reverse biased condition of positive emitter electrode and negative collector electrode as well as in a forward biased condition. Accordingly, a known reverse blocking IGBT comprises a structure for reverse blocking in which a p+ isolation region is formed surrounding the end portion and spanning from front surface to rear surface of the device. An IGBT having that structure, however, failed to achieve reverse breakdown voltage equivalent to forward breakdown voltage when the combination structure of field limit layers and field limit electrodes described earlier is employed.

Measurement of breakdown voltage was made on an example of a reverse blocking IGBT with a rated voltage of 1,200 V by applying forward and reverse biased voltages, and resulted in a forward breakdown voltage of 1,480 V that is satisfactory, but a reverse breakdown voltage of 1,220 V that affords an unacceptably small margin. This poor reverse blocking performance resulted because a depletion layer reaches-through to the principal junction at a reverse bias of about 1,200 V and holes enter the depletion layer generating leakage current through a path beneath the breakdown withstanding structure corresponding to the bias voltage.

As such, in the reverse biased condition, reach-through of depletion layer occurs in the region of the breakdown withstanding structure at a smaller voltage than the forward breakdown voltage. This causes a lower reverse breakdown voltage than forward breakdown voltage. There are two reasons for the reach-through of depletion layer in the reverse-biased condition. First, in the reverse-biased condition, two types of depletion layers develop: a depletion layer that develops vertically from the pn junction at the rear collector layer towards the front surface, and a depletion layer that develops laterally from the peripheral isolation region towards the principal pn junction. With increase of the applied reverse voltage, the two depletion layers pinch off and the number of electrons necessary for depletion of the drift layer decreases with increase of the voltage. This situation tends to expand the depletion layer, resulting in the above-described reach-through at a lower voltage than the forward breakdown voltage. FIG. 27 shows this situation.

Secondly, some depletion layers are joined together at zero bias condition. Depletion layers are joined together in the region from the principal pn junction to a plurality of field limit layers already at zero bias condition. When the depletion layers expand from the rear side and from the isolation layer in a reverse biased condition, the depletion layer reaches-through towards the principal junction at the time when the depletion layer from the rear face and the isolation layer arrive at the field limit layer to which the depletion layer is already expanded at zero bias.

Therefore, the reach-through of depletion layer to the principal junction around the emitter must be prevented in the reverse biased condition, and a structure is needed thereby achieving stable long term reliability.

The present invention is directed to overcoming or at least reducing the effects of one or more of the problems set forth above.

SUMMARY OF THE INVENTION

It is an object of the present invention to prevent the depletion layer from reach-through to the principal junction around the emitter side even in a reverse-biased condition. By achieving this object the above problems are overcome and a breakdown withstanding structure of an IGBT with stable long term reliability is provided.

It is a further object of the invention to provide such a reverse blocking semiconductor device that shows no adverse effect of an isolation region on reverse recovery peak current, that has a breakdown withstanding structure exhibiting satisfactory soft recovery, that suppresses aggravation of reverse leakage current that essentially accompanies a conventional IGBT, and that retains satisfactorily low on-state voltage.

These and other objects according to the invention are provided by a reverse blocking semiconductor device and a manufacturing method therefor. A reverse blocking semiconductor device of the invention comprises a drift layer of a first conductivity type; a MOS gate structure including a base layer of a second conductivity type selectively formed in a front surface region of the drift layer, an emitter region of the first conductivity type selectively formed in a surface region of the base layer, a gate insulation film covering a surface area of the base layer between the emitter region and the drift layer, and a gate electrode formed on the gate insulation film; an emitter electrode in contact with both the emitter region and the base layer; an isolation region of the second conductivity type surrounding the MOS gate structure through the drift layer and extending across whole thickness of the drift layer; a collector layer of the second conductivity type formed on a rear surface of the drift layer and connecting to a rear side of the isolation region; and a collector electrode in contact with the collector layer; wherein a distance W is greater than a thickness d, in which the distance W is a distance from an outermost position of an portion of the emitter electrode, the portion being in contact with the base layer, to an innermost position of the isolation region, and the thickness d is a dimension in a depth direction of the drift layer.

In one preferred embodiment, the collector layer is formed on the rear surface of the drift layer, a thickness of the drift layer having been reduced.

In another preferred embodiment, lattice defects are introduced at least in the base layer.

Preferably lattice defects are introduced homogeneously to whole the front surface of the semiconductor device for a purpose of reducing lifetime of minority carriers in the semiconductor device.

The present invention also provides a method for manufacturing this reverse blocking semiconductor device according to the present invention. The method comprises steps of preparing a substrate of a first conductivity type; forming a MOS gate structure including processes of selectively forming a base layer of a second conductivity type in a front surface region of the substrate, selectively forming an emitter region of the first conductivity type in a surface region of the base layer, forming a gate insulation film on the surface of the base layer, the surface being between the emitter region and the front surface of the substrate without the emitter region, and forming a gate electrode on the gate insulation film; forming an emitter electrode in contact with both the emitter region and the base region; selectively forming a peripheral region of the second conductivity type surrounding the MOS gate structure through a portion of the substrate outside the MOS gate structure, a part of the peripheral region being to become an isolation region; removing a rear surface region of the substrate to a predetermined thickness to form the isolation region extending across whole the thickness and to form a drift layer of the first conductivity type inside the isolation region; forming a collector layer of the second conductivity type on a rear surface of the drift layer and connecting to a rear side of the isolation region; and forming a collector electrode in contact with the collector layer. The steps to manufacture the semiconductor device are conducted in such a manner that a distance W is greater than a thickness d, in which the distance W is a distance from an outermost position of a portion of the emitter electrode, the portion being in contact with the base layer, to an innermost position of the isolation region, and the thickness d is a dimension in a depth direction of the drift layer. The step of selectively forming the peripheral region to become an isolation region is conducted by diffusing impurities using a diffusion mask of an oxide film formed on the front surface of the substrate, the oxide film having a thickness Xox satisfying an inequality of the following Formula (1):

wherein $$X_{ox} > \sqrt{\frac{D_{ox}}{D_S}} X_S \quad \text{Formula (1)}$$

$D_{OX}$ is a diffusion coefficient of the impurity in the oxide film,
$D_S$ is a diffusion coefficient of the impurity in material of the substrate,
$X_S$ is a diffusion depth of the impurity in material of the substrate.

When holes are injected from a collector, the holes generally tend to flow in the shortest path. If the distance from the isolation region to a surface contact region of the emitter electrode, which is a distance in the breakdown withstanding structure region from the isolation region to a so-called active region, is longer than the thickness of the n− drift layer, the holes tends to be injected from the collector positioned just under the active region and flow towards the emitter electrode, rather than injected from the isolation region. As a result, hole injection from the isolation region towards the active region relatively decreases. Further, when the distance between the isolation region and the active region is longer than an ambipolar diffusion length of the minority carriers, that are holes, the concentration of the holes injected from the isolation region decays rapidly enough. Therefore, hole injection from the isolation region can be ignored in this case.

Since introduction of lattice defects decreases lifetime, introduction of lattice defects at least in the p+ base layer 4 reduces emitter injection efficiency. However, if the lattice defects are introduced locally in the surface region only, loss tradeoff relationship deteriorates. Accordingly, the lattice defects are preferably introduced into the whole device homogeneously in the depth direction and in the radial direction. Electron beam irradiation is preferably employed for such introduction of lattice defects. Because the collector is inherently made low injection, if the electron beam irradiation dose is too large or acceleration voltage is too high, damage to the device is severe and the lifetime becomes too short, resulting in an increase in on-state voltage.

Accordingly, a preferred method for manufacturing a reverse blocking semiconductor device according to the present invention comprises a step of introducing lattice defects homogeneously to whole of the front surface of the semiconductor device in order to reduce the lifetime of minority carriers in the semiconductor device. The step of introducing the lattice defects is conducted by electron beam irradiation with an energy less than 5 MeV and a dose less than 100 kGy. An energy less than 5 MeV and an irradiation dose less than 100 kGy controls the increase in on-state voltage minimum and suppresses reverse leakage current.

Another preferred method for manufacturing a reverse blocking semiconductor device according to the present invention comprises a step of introducing lattice defects at least in the base layer by electron beam irradiation with a dose in a range of 20 kGy to 60 kGy.

A reverse blocking semiconductor device according to the present invention comprises a drift layer of a first conductivity type; a MOS gate structure including a base layer of a second conductivity type selectively formed in a front surface region of the drift layer, an emitter region of the first conductivity type selectively formed in a surface region of the base layer, a gate insulation film covering a surface area of the base layer between the emitter region and the drift layer, and a gate electrode deposited on the gate insulation film; an emitter electrode in contact with both the emitter region and the base layer; an isolation region of the second conductivity type surrounding the MOS gate structure through the drift layer and extending across the whole thickness of the drift layer; a collector layer of the second conductivity type formed on a rear surface of the drift layer and connecting to a rear side of the isolation region; a collector electrode in contact with the collector layer; a plurality of field limit layers of the second conductivity type in the front surface region of the drift layer between the emitter electrode and the isolation region, each of the field limit layers having a ring shape; and a plurality of field limit electrodes, each in contact with each of the field limit layers, having a ring shape, and at a floating electric potential; wherein a plurality of the field limit electrodes exist in the side of the emitter electrode and each of the field limit electrodes in the side of the emitter electrode has a larger outward extension portion than an inward extension portion; and a plurality of the field limit electrodes exist in the side of the isolation region and each of the field limit electrodes in the side of the isolation region has a larger inward extension portion than an outward extension portion.

Preferably the reverse blocking semiconductor device of the invention additionally comprises at least one high concentration layer of the first conductivity type in at least a portion of one of the front surface region of the drift layer in the side of the emitter electrode and the front surface region of the drift layer in the side of the isolation region, the high concentration layer containing higher concentration of impurities than the drift layer.

Advantageously, a surface concentration of impurities in the high concentration layer is less than $10^{17}$ cm$^{-3}$.

It is preferred that a distance Wg between the adjacent field limit layers is larger than 2 times the Wbi, the Wbi being a width of a built-in depletion layer extending from the field limit layer towards the drift layer in a condition in which the emitter electrode and the collector electrode are at an equal electric potential.

Advantageously, WGi>1.6 Xj+2 Wbi in which WGi is a width of an insulator film between (I−1)-th field limit layer and i-th field limit layer, Xj is a diffusion depth of the field limit layer, and Wbi is a width of a built-in depletion layer extending from the field limit layer towards the drift layer in a condition in which the emitter electrode and the collector electrode are at an equal electric potential.

Preferably a thickness of the drift layer Wdrift satisfies the inequality in the following Formula (2):

$$\sum_{i=1}^{n} L_{Ni} \geq W_{drift} \quad \text{Formula (2)}$$

wherein $$L_{Ni} = W_{Gi} - (1.6X_j + 2W_{bi})$$

in which
i is an order number of the field limit layer,
W$_G$i is the width of an insulator film of oxide between (i−1)-th and i-th field limit layer,
n is the total number of the field limit layers.
Xj is a diffusion depth of the field limit layer, and Wbi is a width of a built-in depletion layer extending from the field limit layer towards the drift layer in a condition in which the emitter electrode and the collector electrode is at an equal electric potential.

Preferably, the sum Σ LNi and a sum Σ LOPi satisfies an inequality Σ LOPi/Σ LNi<0.7, in which LOPi is a distance between (i−1)-th field limit electrode and i-th field limit layer.

In a preferred embodiment, a reverse blocking semiconductor device of the invention additionally comprises an intermediate field buffer region of the second conductivity type in a surface region of the drift layer between the plurality of field limit electrodes in the side of the emitter electrode and the plurality of field limit electrodes in the side of the isolation region.

BRIEF DESCRIPTION OF THE DRAWINGS

The foregoing advantages and features of the invention will become apparent upon reference to the following detailed description and the accompanying drawings, of which:

FIG. 10 is a sectional view of the breakdown withstanding structure of third example of embodiment; FIG. 10(a) is a sectional view of whole breakdown withstanding structure, while FIGS. 10(b) through 10(d) are partial sectional views of variations from the portion Y in FIG. 10(a).

FIGS. 11(a) and (b) are sectional views of the breakdown withstanding structure illustrating development of depletion layer in a forward biased condition (FIG. 11(a)) and a reverse biased condition (FIG. 11(b)).

FIG. 12(a) shows a case a width WG of the oxide film is wide.

FIG. 15(a) shows net doping, FIG. 15(b) shows electron concentration, FIG. 15(c) shows equipotential lines, and FIG. 15(d) shows hole current density.

FIGS. 16(a) through (d) are schematic partial sectional views of the breakdown withstanding structure region with an opening width Lop of 7 μm. FIGS. 16(a), (b), (c), and (d) show net doping, electron concentration, equipotential lines, and hole current density, respectively.

FIG. 17(a) shows a cross section of the breakdown withstanding structure region.

FIG. 20 shows schematically a partial cross section of the breakdown withstanding structure region of an embodiment in which an n type high concentration layer is formed in the isolation region side of the breakdown withstanding structure region. FIGS. 20(a) through (d) illustrate net doping, electron concentration, equipotential lines, and hole current density, respectively.

DETAILED DESCRIPTION OF PREFERRED EMBODIMENTS

The present invention provides a reverse blocking semiconductor device that shows no adverse effect of an isolation region on reverse recovery peak current, that has a breakdown withstanding structure exhibiting satisfactorily soft recovery, and that suppresses aggravation of recovery leakage current that essentially accompanies a conventional reverse blocking IGBT; and yet, on-state voltage is controlled within a satisfactorily low value. Consequently, a matrix converter can be constructed with easy operation and low loss using an invented reverse blocking semiconductor device.

Figure 1:
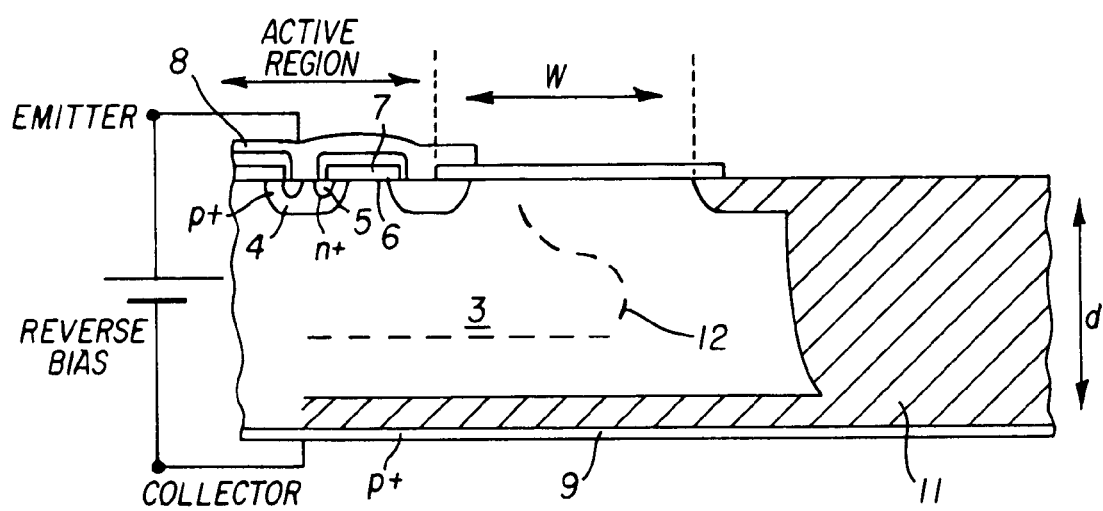
FIG. 1 is a schematic sectional view of an essential part of an embodiment of a reverse blocking semiconductor device according to the present invention.

FIG. 1 is a sectional view of an essential part of a reverse blocking IGBT of an exemplary embodiment of the present invention illustrating the relationship between a distance W between an isolation region and an active region, and a thickness d in a depth direction of an n– drift layer.

Figure 2:
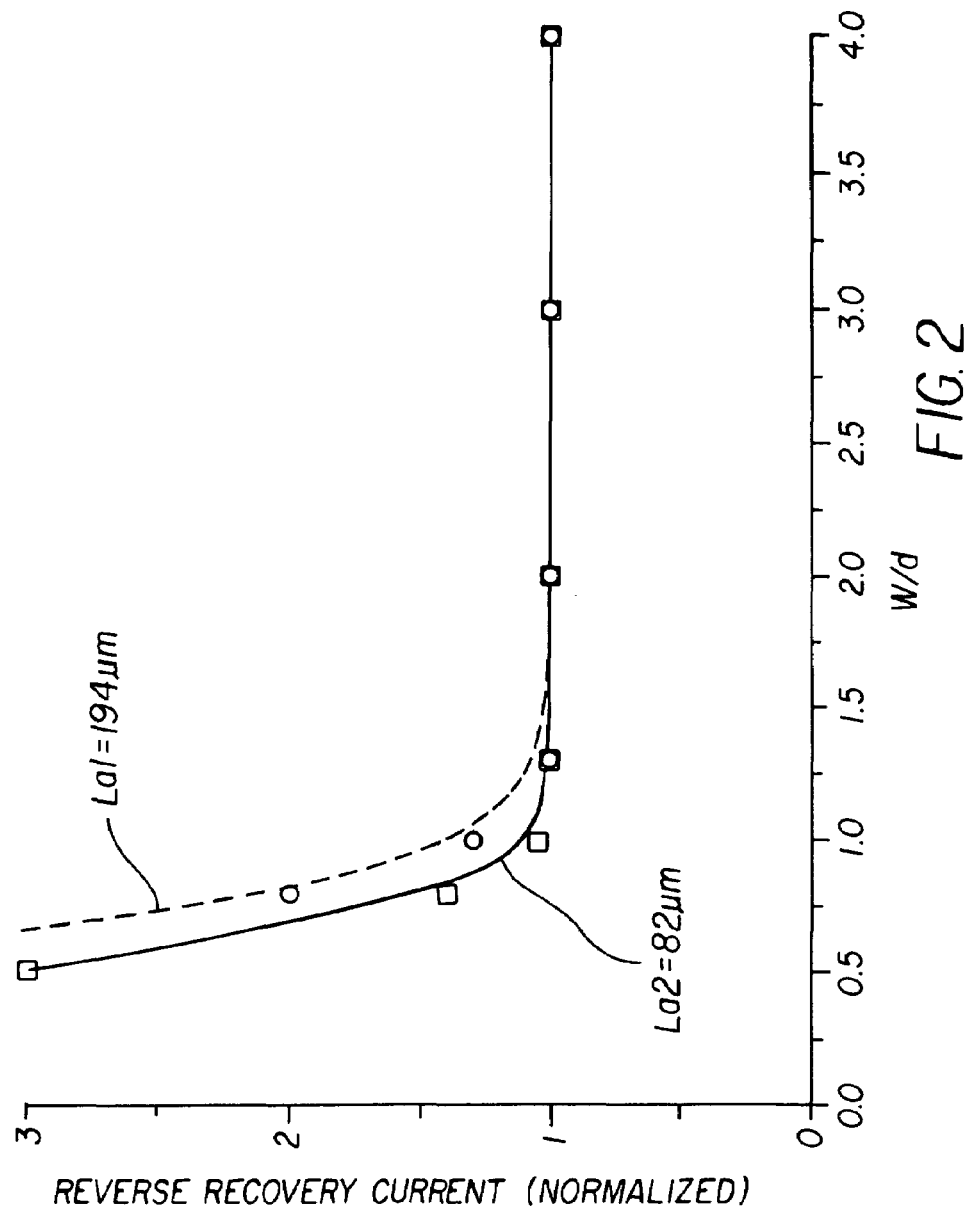
FIG. 2 is a characteristic chart showing dependence of reverse recovery current in diode operation on the distance W between an isolation region and an active region in an embodiment of a reverse blocking IGBT according to the present invention.

FIG. 2 is a characteristic chart showing dependence of reverse recovery current in diode operation on the distance W in a reverse blocking IGBT for 600 V breakdown voltage applying the teachings of the present invention. In FIG. 2, the abscissa represents the ratio W/d, where W is the distance between the isolation region and the active region, and d is the thickness of the n– drift layer. More particularly, W is the distance from an outermost position of a portion of the emitter electrode, the portion being in contact with the p+ base layer 4, to an innermost position of the p+ isolation region. The distance W is indicated in FIG. 1. The ordinate in FIG. 2 represents reverse recovery peak current normalized by the value at W/d of four and at W of two times ambipolar diffusion length La. Here, applied voltage Vcc in the reverse recovery is 100 V. Structure of the IGBT is as follows.

An n– type FZ wafer is prepared having thickness of 525 μm and impurity concentration of $31.5 \times 10^{14}$ cm$^{-3}$. An initial oxide film 1.6 μm thick is formed on the front surface of the wafer. A region with a width of 100 μm is selectively etched on a peripheral portion of each device. A boron source is applied to the front surface and heat treatment is conducted to perform boron deposition. After removing boron in the oxide film by a boron glass etching process, diffusion of the boron is performed to a depth of 120 μm at 1,200° C. in an oxygen atmosphere to form a p+ isolation region 11. A MOS gate structure as in a common IGBT is formed in the front surface region. The MOS gate structure includes p+ base layer 4, n+ emitter region 5, gate oxide film 6, gate electrode 7, and emitter electrode 8. After that, a rear surface of the wafer is ground to a thickness of 100 μm to form n– drift layer 3. The thickness is appropriately about 180 μm in the case of an IGBT with a breakdown voltage of about 1,200 V. Then, ion implantation of boron is conducted with a dose of $1 \times 10^{13}$ cm$^{-2}$ the rear surface and annealing at 350° C. for 1 hour is followed, to form p+ collector layer 9 with a peak concentration of $1 \times 10^{17}$ cm$^{-3}$ and a thickness of about 1 μm. Finally, a collector electrode is formed.

Thus, a reverse blocking IGBT is produced. The collector layer may be activated after the boron ion implantation to the rear surface by irradiating with a wholly solid-state YAG 2ω laser in the range of 500 mJ/cm$^2$ to 4 J/cm$^2$. The distance W in this example is in a range of 80 μm to 400 μm.

When W/d is smaller than one, i.e., the distance W from the active region to the isolation region is less than the thickness d of the n– drift layer, the reverse recovery peak current rapidly increases. With decrease of the distance W to the isolation region, hole injection from the isolation region becomes dominant over injection from the collector layer. This is due to the fact that acceptor concentration in the isolation region is higher by more than two orders of magnitude than that in the p+ collector layer and the distance from the isolation region to the emitter electrode is shorter than the drift layer thickness, resulting in lower resistance for hole injection from the isolation region. Consequently, carrier concentration is larger in the rear side in the carrier distribution in the on-state of the IGBT. Reflecting the situation, reverse recovery peak current is relatively large in the case of W/d smaller than one.

In the case lifetime is decreased, the reverse recovery peak current is further reduced in comparison with the case of non-killer, in which the lifetime is not decreased. In FIG. 2, the ambipolar diffusion length La1=194 μm in the case of non-killer, while the ambipolar diffusion length La2=82 μm in the case an electron beam of 4 Mrad (=40 kGy) is irradiated. The thickness d of the n– drift layer is about 100 μm. The electron beam irradiation decreased the reverse recovery current.

Some specific examples of embodiment of the present invention will be described in the following.

EXAMPLE 1

Reverse leakage current is generally larger than leakage current in a usual forward direction IGBT. This is because of the high dose of the p+ layer in contact with the emitter electrode on the one hand, and because residual lattice defects or damage at the time of low temperature activation of the collector layer on the other hand.

Figure 3:
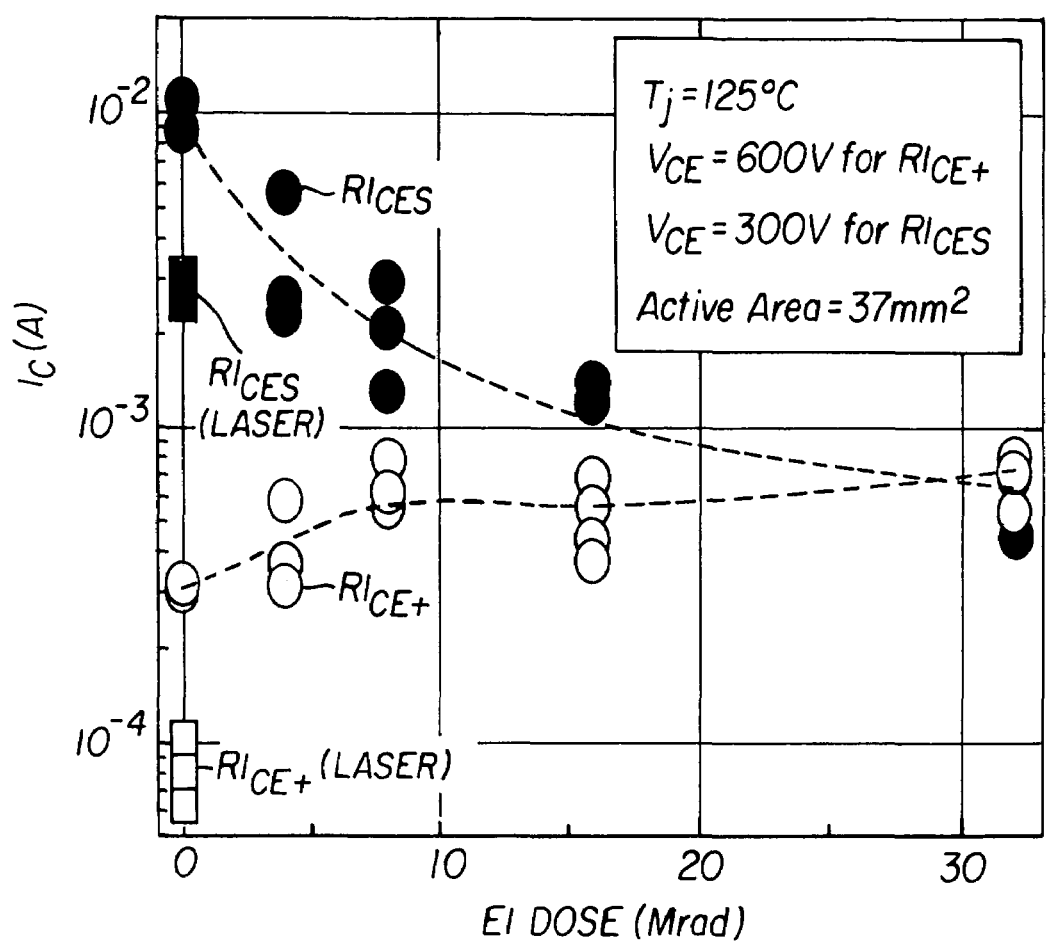
FIG. 3 shows dependence of reverse leakage current Rices on electron beam irradiation dose.
Figure 4:
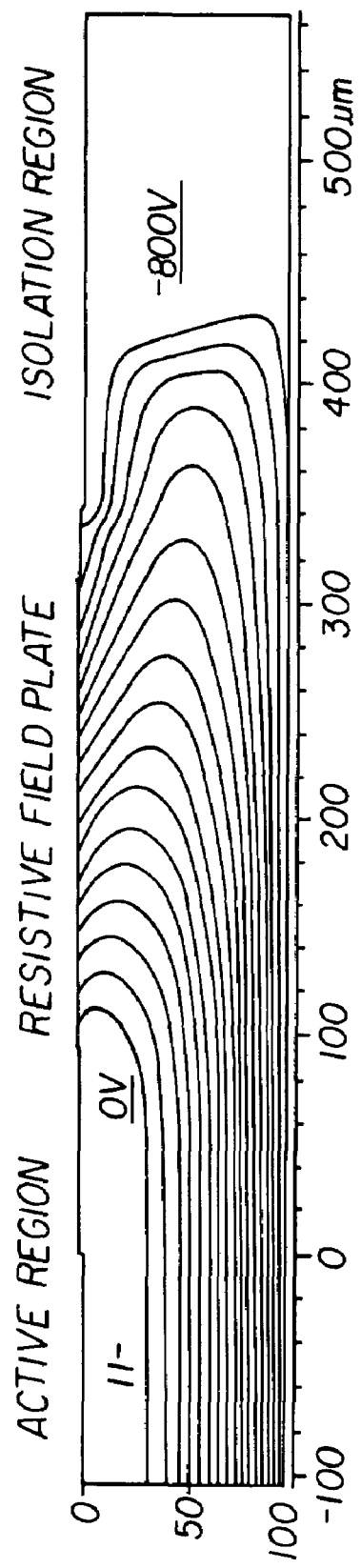
FIG. 4 shows distribution of equipotential lines when reverse bias voltage of 800 V is applied to the 600 V reverse blocking IGBT of an embodiment according to the present invention.

FIG. 3 shows dependence of reverse leakage current RIces on electron beam irradiation dose. FIG. 4 shows distribution of equipotential lines when a reverse bias voltage of 800 V is applied to the 600 V reverse blocking IGBT. A zero volt line lies at about 30 μm from the front surface. The front surface side of the 0-V line is a neutral region without depletion of electric charges. The p+ layer is usually formed with a dose of more than $1 \times 10^{19}$ atoms/cm$^3$ to avoid latch-up as described in background of the invention. The RIces is represented by the following Formula (3)

$$RI_{CES} = \beta(I_{gen\_n} + I_{gen\_p}) + I_{diff} \quad \text{Formula (3)}$$

where $I_{gen\_n}$ and $I_{gen\_p}$ are generation currents in the drift layer and the collector layer, respectively. $I_{diff}$ is diffusion current of minority carriers, the current being negligible at high temperature.

From the Formula (3), an emitter amplification factor β is, $$\beta = \frac{1}{1 - \gamma \alpha_T} \cong \frac{1}{1 - \alpha_T} \cong \frac{2D_h \tau_p}{W_D^2} \quad \text{Formula (4)}$$

Second order approximation is used to obtain the Formula (4). Emitter injection efficiency γ is approximately one in a reverse biased transistor. $\tau_p$ represents lifetime of minority carriers, and Dh represents diffusion coefficient of holes in the drift layer. $W_D$ represents a neutral region width in the drift layer, which is about 30 μm in the case of FIG. 4. Hence, $I_{gen\_n}$ is represented by Formula (5) below.

$$I_{gen\_n} = \frac{q n_i A W}{2 \tau_{sc}} \quad \text{Formula (5)}$$

where A is an area of the active region, W: depletion layer width, $\tau_{sc}$: generation lifetime in the space charge region. Dominant captured level due to the electron beam irradiation is sufficiently shallow and $\tau_p$ is shorter enough than $\tau_{sc}$. Therefore, the Rices is sufficiently small.

The abscissa in FIG. 3 represents electron irradiation dose in Mrad (1 Mrad=10 kGy), the ordinate represents reverse leakage current RIces. FIG. 3 illustrates leakage currents RIces for without bias at the gate (G-E short circuited) and RIce+ for application of G-E voltage of +15 V at the gate in the case with a collector layer thermally activated at 350° C. for 1 hour; and a leakage current RIce+ (Laser) for application of G-E voltage of +15 V at the gate in the case with the p+ collector layer laser activated. FIG. 3 shows that reverse leakage current is larger in the case with the gate and emitter short-circuited than the cases of a +15 V application. The application of +15 V at G-E forms an inversion layer (threshold value is 7.5 V) that short-circuits the n+ emitter layer and the n– drift layer. Thus, parallel pin diode structures are formed, thereby decreasing hole injection efficiency in the front surface side. In actual converter operation, however, the reverse leakage current is desired to be small, even without bias voltage on the gate. FIG. 3 shows that electron beam irradiation reduces the reverse leakage current in no bias condition between G-E, and the leakage current is reduced to nearly the same value as the case of G-E +15 V application, by irradiation of the dose of 10 Mrad (=100 kGy). This result demonstrates an effect of reduction of amplification factor of the above-noted pnp transistor. FIG. 3 further shows that reverse leakage current is suppressed to less than ⅓ by laser irradiation that fully recrystallizes the region around the p+ collector layer. This is also the above-noted effect of suppression of generation current in the p+ layer.

On-state voltage of the IGBT is 2.0 V for no electron beam irradiation, 2.2 V for 10 Mrad irradiation, and 2.8 V for 20 Mrad irradiation. It has been shown that on-state voltage enhancement can be controlled within 10% for irradiation up to 10 Mrad.

Next the thickness of an SiO2 film for a mask for selectively forming the heavily doped p+ isolation region will be described. As described earlier, an oxide film is formed in an initial stage of the manufacturing process, and then selectively etched on the area for forming a p+ isolation region. Thickness of the oxide film necessary to form the isolation region can be calculated as follows.

Figure 5:
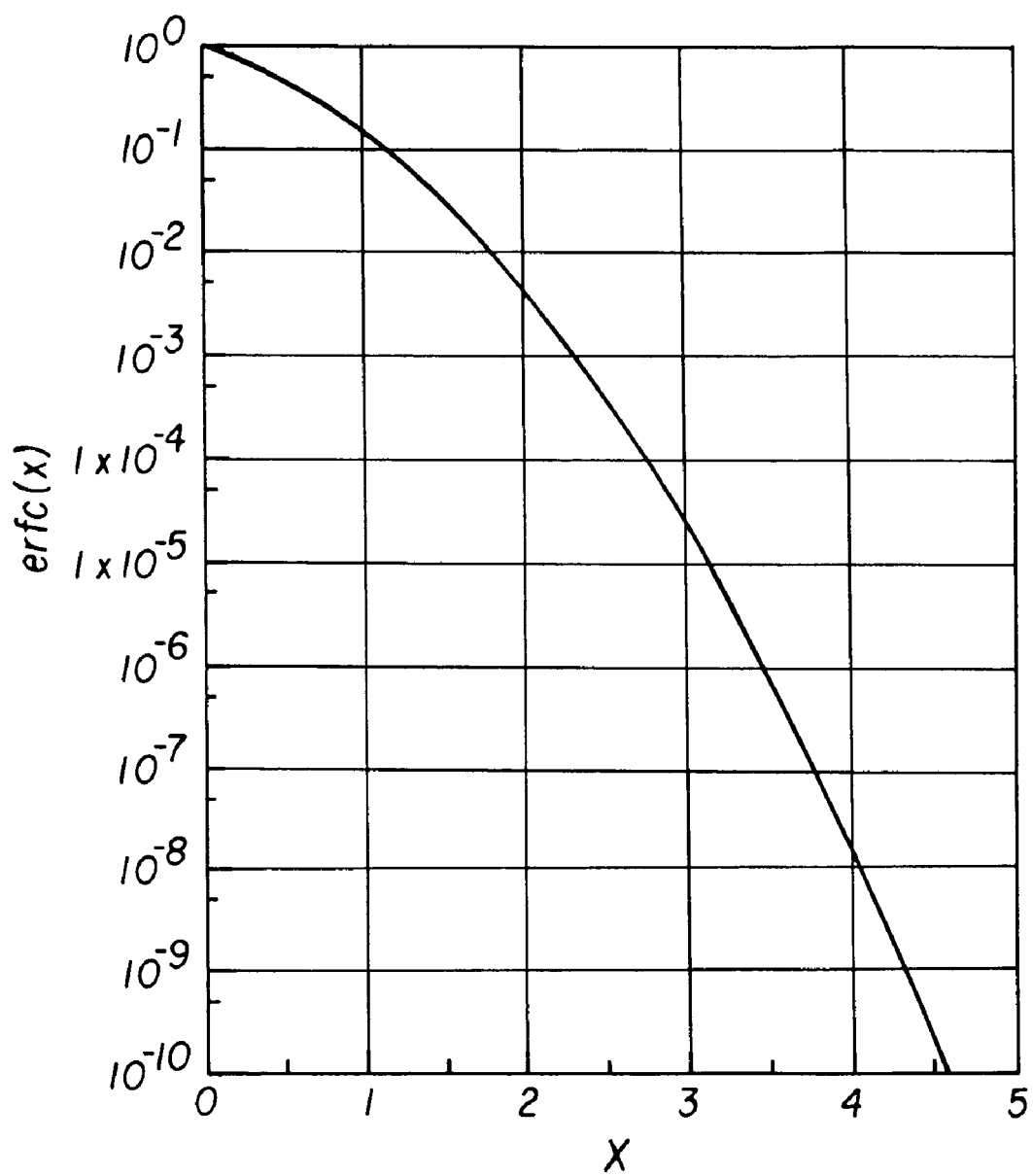
FIG. 5 is a graph of complimentary error function.

Impurity concentration distribution under existence of a diffusion source is given by the following Formula (6), $$N_{Si}(x_{Si}, t) = N_0 \mathrm{erfc}\left(\frac{x_{Si}}{2\sqrt{D_{Si}t}}\right) \quad \text{Formula (6)}$$

where $N_{Si}$ is impurity concentration in silicon, $N_0$ is impurity concentration at a surface position, $x_{Si}$ is a distance from the surface in the silicon, $D_{Si}$ is a diffusion coefficient of boron in the silicon, and t is diffusion time. The diffusion coefficient $D_{Si}$ is represented by $$D_{Si} = D_\infty \exp\left(-\frac{E_a}{kT}\right) \quad \text{Formula (7)}$$

where $D\infty$ is a constant, Ea, an activation energy, k, Boltzmann constant, and T, absolute temperature. The activation energy Ea is about 3.7 eV. The diffusion coefficient is $1.0 \times 10^{-11}$ cm$^2$/s at 1,300° C. Diffusion depth required for a 600 V class reverse blocking IGBT is 120 μm. In actual diffusion, the diffusion depth of 120 μm was attained with a surface impurity concentration of $1.2 \times 10^{19}$ cm$^{-3}$, diffusion temperature of 1,300° C., and diffusion time of 83 hour. Letting the impurity concentration $N_{Si}$ in Formula (6) equal the doping concentration of the n type wafer, i.e., $1.5 \times 10^{14}$ cm$^{-3}$, which is a condition at the pn junction, then $N_{Si}/N_0$ equals $1.25 \times 10^{-5}$. Using the complimentary error function (erfc) shown in FIG. 5, $x_{Si}$=104 μm is obtained. This value approximately agrees with the experimental value.

Boron diffusion in a thermal oxide film is similarly represented by $$N_{ox}(x_{ox}, t) = N_0 \mathrm{erfc}\left(\frac{x_{ox}}{2\sqrt{D_{ox}t}}\right) \quad \text{Formula (8)}$$

where $x_{ox}$ is a distance from the surface of the oxide film, and $D_{ox}$ is a diffusion coefficient of boron in the oxide film. Activation energy of boron in the oxide film is about 3.5 eV. Diffusion coefficient at 1,300° C. is $1.29 \times 10^{-15}$ cm$^2$/s. A condition for the boron to pass through the oxide film having thickness of 1.6 μm can be obtained as follows. Letting $x_{ox}$=1.6 μm and $N_{ox}$ equal the doping concentration of the n type wafer, i.e., $1.5 \times 10^{14}$ cm$^{-3}$, then t=153 hour is obtained using FIG. 5. This means that an oxide film 1.6 μm thick allows masking for up to 150 hour. In actual diffusion, boron is drawn out from the oxide film to the silicon at the Si/SiO$_2$ interface due to larger diffusion coefficient in the silicon side, thereby further reducing boron concentration at the silicon surface. According to process simulation, the boron concentration is smaller by an order of magnitude than the value calculated by Formula (8). This means that Formula (8) gives a safer estimate. Boron diffusion in silicon for t=153 hour results in a diffusion depth of $x_{Si}$=141 μm according to Formula (6). The maximum depth of possible selective diffusion is 141 μm when a mask of oxide film having thickness of 1.6 μm is used. More generally, the relationship between diffusion time $t_d$ and the thickness of an oxide film $X_{ox}$ that is just passed through by boron is given by Formula (9) using Formula (8).

$$N_{ox}(X_{ox}, t_d) = N_D = N_0 \mathrm{erfc}\left(\frac{X_{ox}}{2\sqrt{D_{ox}t_d}}\right) \quad \text{Formula (9)}$$

where $N_D$ is doping concentration of the n type silicon. Letting a diffusion depth in silicon be $X_{Si}$ at this time, following Formula (10) is derived using Formula (6).

$$N_{Si}(X_{Si}, t_d) = N_D = N_0 \mathrm{erfc}\left(\frac{X_{Si}}{2\sqrt{D_{Si}t_d}}\right) \quad \text{Formula (10)}$$

According to Formulas (9) and (10), $$N_0 \mathrm{erfc}\left(\frac{X_{Si}}{2\sqrt{D_{Si}t_d}}\right) = N_0 \mathrm{erfc}\left(\frac{X_{ox}}{2\sqrt{D_{ox}t_d}}\right) \quad \text{Formula (11)}$$

Therefore, the following Formula (12) is derived.

$$\frac{X_{Si}}{X_{ox}} = \sqrt{\frac{D_{Si}}{D_{ox}}} \approx 88 \text{ (at 1300° C.)} \quad \text{Formula (12)}$$

Thus, the maximum diffusion depth in silicon is determined by square root of a ratio of diffusion coefficient of boron in silicon to diffusion coefficient of boron in an oxide film for a fixed thickness of a mask oxide film, and in no way depends on surface concentration or diffusion time. Activation energy of boron diffusion is approximately equal in silicon and in an oxide film, and is about 3.5 eV. Consequently, the ratio of the diffusion coefficients is constant at any temperature as implied by Formula (7). The above analysis concludes that given a thickness of the mask oxide film, the maximum diffusion depth in silicon is uniquely determined. Necessary diffusion depth is 120 μm for a 600 V reverse blocking IGBT. According to Formula (12), the minimum necessary thickness of oxide film is 1.36 μm. For a 1,200 V reverse blocking IGBT, a necessary diffusion depth is 200 μm and the minimum necessary thickness of oxide film is 2.27 μm.

The analysis to this point has been based on the case of diffusion using a diffusion source. Next, the case of driving-in is considered, in which the diffusion source is removed after deposition.

Distribution of boron concentration in an oxide film is represented by the following Formula (13).

$$N'_{ox}(x_{ox}, t) = \frac{Q_{ox}}{\sqrt{\pi D_{ox}(t)}} \exp\left(-\frac{x_{ox}^2}{4D_{ox}(t)}\right) \quad \text{Formula (13)}$$

where $Q_{ox}$ is total number of impurities in the oxide film, and represented by the following expression using Formula (8), in which $t_p$ is deposition time.

$$Q_{ox} = \int_0^\infty N(x_{ox}, t_p) dx = \frac{2}{\sqrt{\pi}} N_0 \sqrt{D_{ox} t_p} \quad \text{Formula (14)}$$

Substituting Formula (14) in Formula (13), gives Formula (15):

$$N'_{ox}(x_{ox}, t) = \frac{2N_0}{\pi} \sqrt{\frac{t_p}{t}} \exp\left(-\frac{x_{ox}^2}{4D_{ox} t}\right) \quad \text{Formula (15)}$$

For diffusion in silicon, similarly, $$N'_{Si}(x_{Si}, t) = \frac{2N_0}{\pi} \sqrt{\frac{t_p}{t}} \exp\left(-\frac{x_{Si}^2}{4D_{Si} t}\right) \quad \text{Formula (16)}$$

Provided an oxide film with a thickness $X_{ox}$ is just passed through at a diffusion time $t_d$ and a diffusion depth in silicon is $X_{Si}$ at that time, $$N'_{Si}(X_{Si}, t_d) = N'_{ox}(X_{ox}, t_d) \quad \text{Formula (17)}$$

Therefore, the exactly same result as Formula (12) is obtained using Formulae (15) and (16), i.e. the maximum diffusion depth is determined by a thickness of a mask oxide film.

Figure 6:
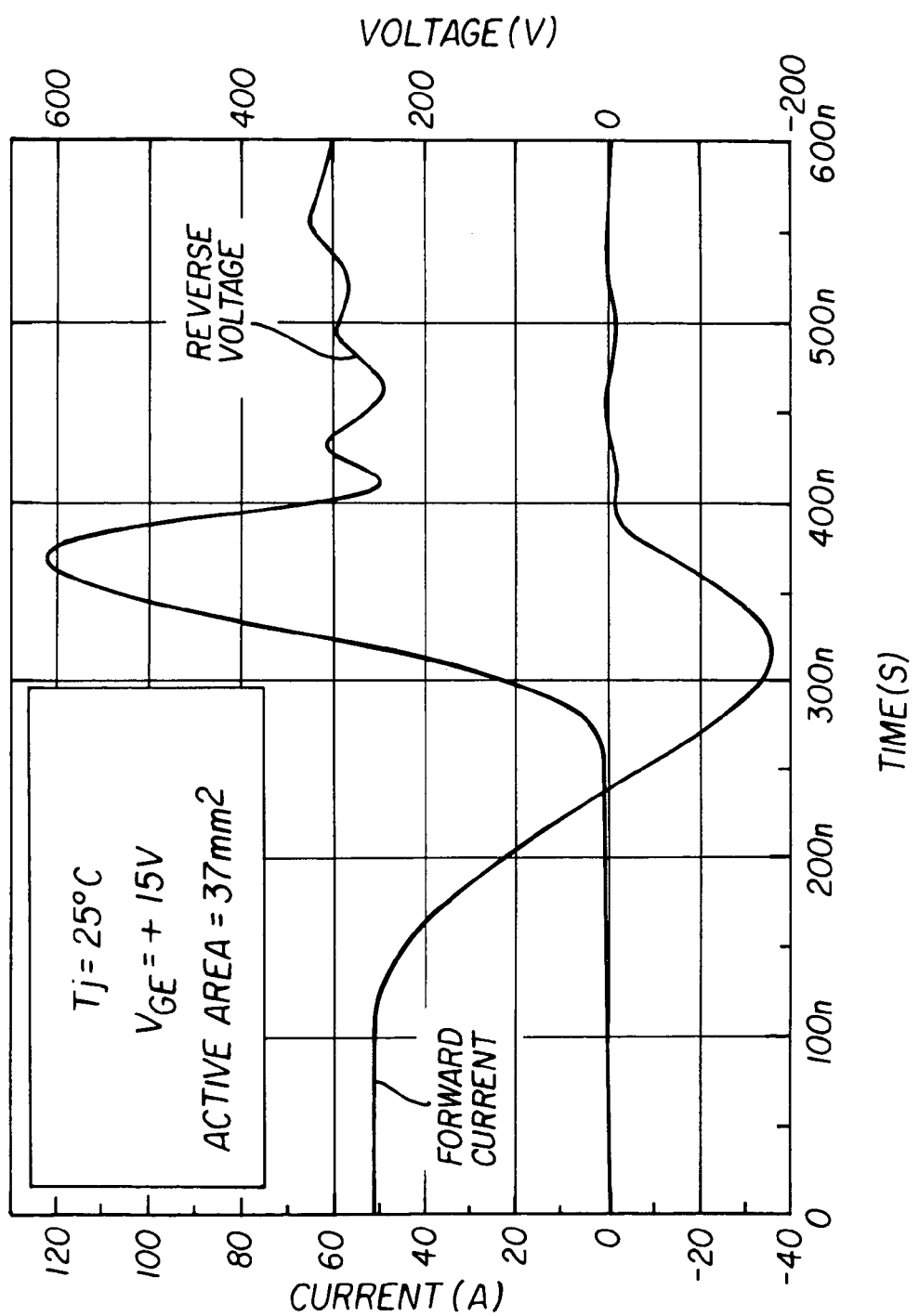
FIG. 6 is a characteristic chart showing reverse recovery operation of a reverse blocking IGBT according to the present invention.

FIG. 6 is a characteristic chart showing reverse recovery operation of a reverse blocking IGBT according to the present invention.

EXAMPLE 2

Figure 7:
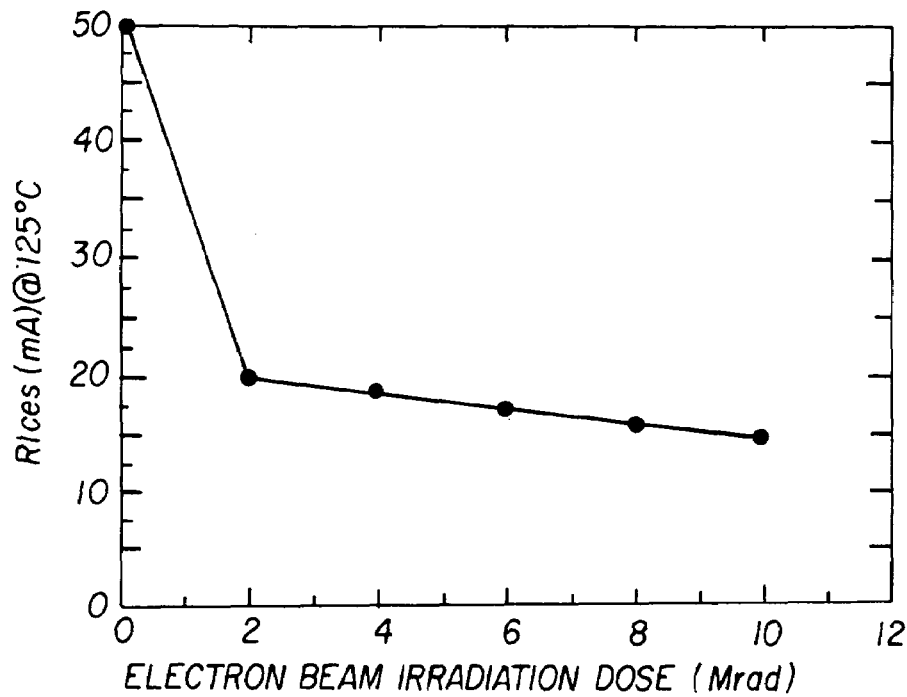
FIG. 7 shows dependence of reverse leakage current RIces on electron beam irradiation dose.
Figure 8:
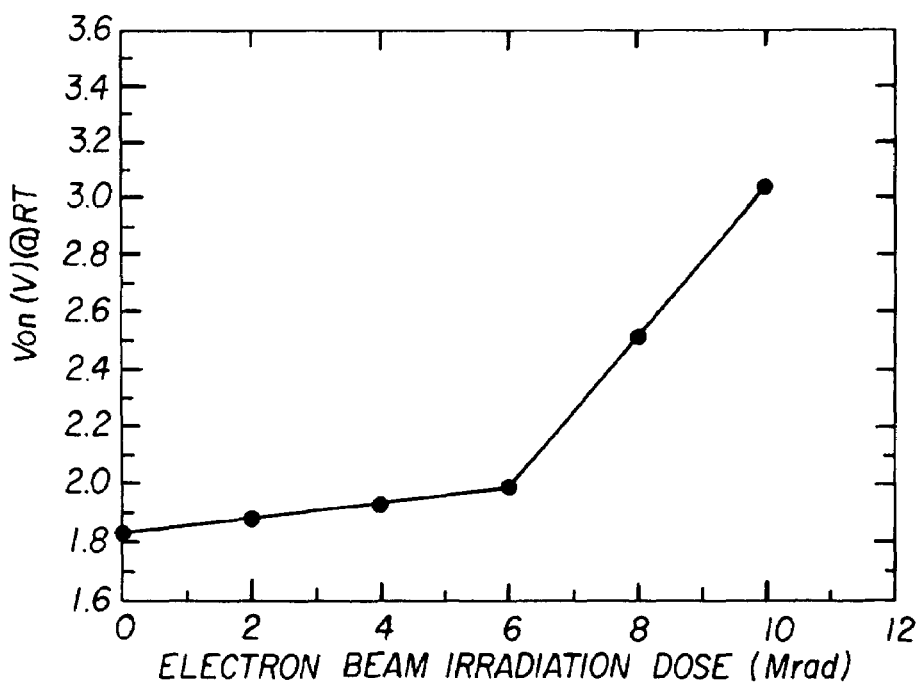
FIG. 8 shows dependence of on-state voltage on electron beam irradiation dose.

FIGS. 7 and 8 show characteristics of a second embodiment of the invention that is different from that shown in Example 1. FIG. 7 shows the relationship between electron beam dose and reverse leakage current, and FIG. 8 shows relationship between electron beam dose and on-state voltage. This embodiment comprises p+ collector layer 9 with a peak concentration of $1\times10^{17}$ cm$^{-3}$ and a thickness of about 1 μm that is formed by ion implantation of boron with a dose of $5\times10^{13}$ cm$^{-2}$ on a rear surface followed by annealing at 400° C. for 1 hour.

In FIG. 7, the abscissa represents electron beam irradiation dose in Mrad (1 Mrad=10 kGy), and the ordinate represents reverse leakage current RIces. Electron beam irradiation or helium irradiation is implemented before grinding a rear surface of an FZ wafer for the purpose of fast operation of a device. The electron beam irradiation can also reduce reverse leakage current. Since the electron bean generates lattice defects homogeneously in the bulk of a device, transport efficiency in a reverse-biased condition is drastically reduced, thereby decreasing a current amplification factor.

In FIG. 7, dependence of reverse leakage current on electron beam irradiation dose with applied voltage of 600 V at 125° C. is shown for a device of a breakdown voltage of 600 V. As apparent in the figure, reverse leakage current decreases with increase of electron beam irradiation dose. Since irradiation of 2 Mrad abruptly reduces reverse leakage current, favorable electron beam irradiation dose is about 2 Mrad or more.

Nevertheless, electron beam irradiation generates lattice defects in the bulk of a device, leading to elevation of on-state voltage. The on-state voltage is an important characteristic, and preferably is as low as possible. In FIG. 8, the abscissa represents electron beam irradiation dose in Mrad (1 Mrad=10 kGy) and the ordinate represents on-state voltage. On-state voltage increases with an increase of electron beam irradiation dose. Irradiation of more than 6 Mrad increases the on-state voltage rapidly. To control the on-state voltage low, electron beam irradiation dose is preferably about 6 Mrad or smaller.

EXAMPLE 3

Figure 9:
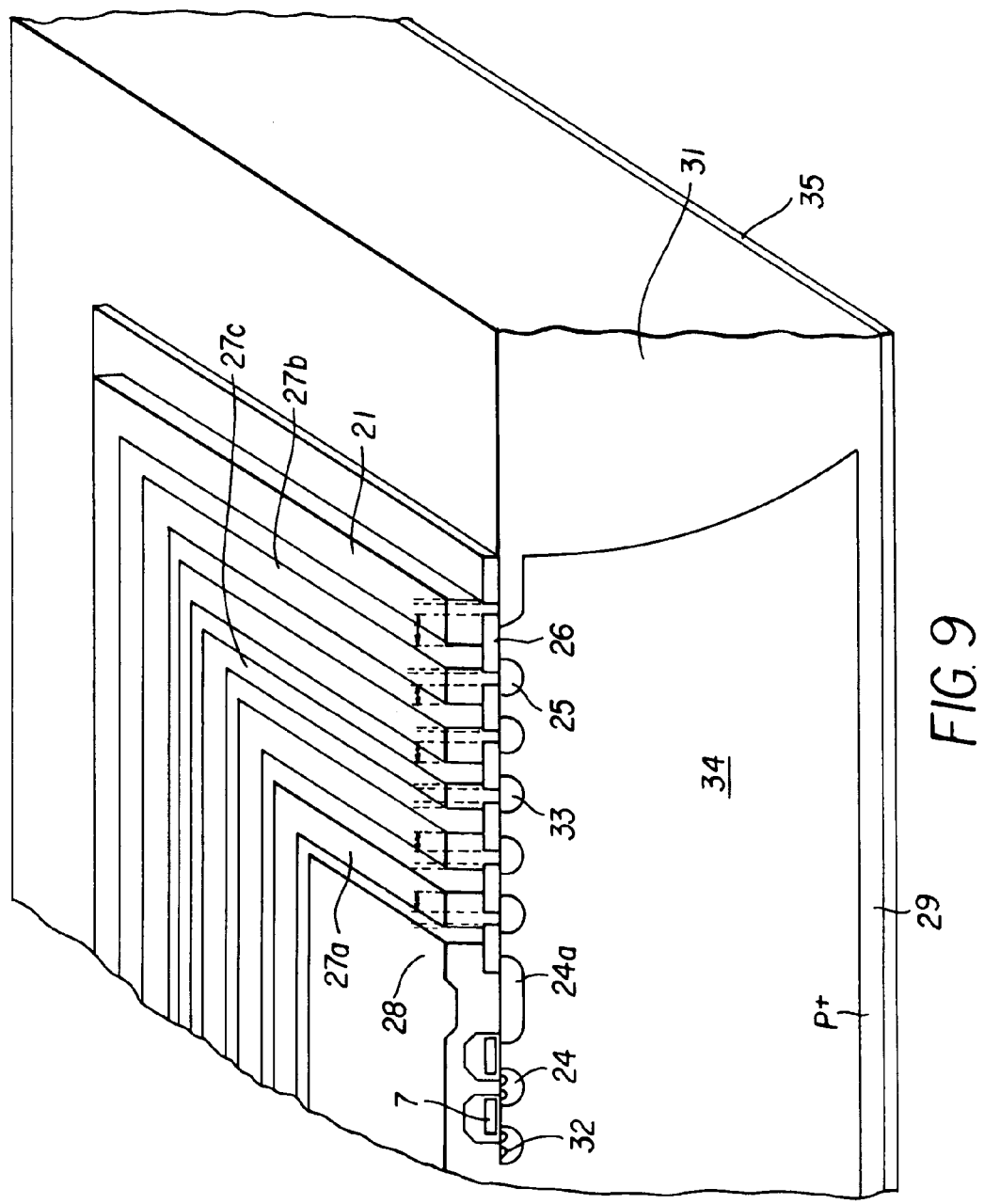
FIG. 9 is a perspective view of a breakdown withstanding structure of a third example of embodiment.

FIGS. 9 and 10 show a structure of a third embodiment according to the present invention. FIG. 9 is a perspective view of a breakdown withstanding structure, and FIG. 10 is a sectional view of the breakdown withstanding structure. FIG. 10(a) is a sectional view of whole breakdown withstanding structure, while FIGS. 10(b) through 10(d) are partial sectional views of variations from the portion Y in FIG. 10(a).

N type FZ wafer 34 with resistivity of 80 Ωcm is prepared and a thermal oxide film 2.4 μm thick is formed on the front surface of the wafer. The thermal oxide film in a scribe region for dividing to chips is removed and exposed. After applying boron glass to the exposed region and removing the boron glass, driving-in is executed at 1,300° C. for 250 hour, so that p+ isolation region 31 is formed in the scribe region. Then, a thermal oxide film is formed, which is selectively etched to expose areas for forming field limit layers 25. Ion implantation of boron is conducted with a dose of $2\times10^{15}$/cm$^2$ and an energy of 100 keV, followed by driving-in at 1,150° C. for 200 minutes. Subsequently, openings for forming an active region are formed in the thermal oxide film. A gate oxide film 65 nm thick is formed. A polycrystalline silicon film is grown on the gate oxide film and selectively etched to form a gate electrode. At this moment, the polycrystalline silicon of a portion of the breakdown withstanding structure is removed. Ion implantation of boron is executed for forming p+ base layer 24 with a dose of $2\times10^{14}$/cm$^2$ and an energy of 100 keV, followed by driving-in at 1,150° C. for 120 minutes. After selectively forming a resist film, arsenic ions are implanted with a dose of $2\times10^{15}$/cm$^2$ and an energy of 45 keV. A BPSG (borophosphosilicate glass) film for layer insulation is grown and portions of the film on the active region and field limit layers 25 are opened. Al-1% Si films are deposited to form emitter electrode 28 and gate electrode 7 in the active region, and field limit electrodes 27 in the breakdown withstanding structure region. Then, a nitride film or a polyimide film is deposited and etched.

The rear surface side of the wafer is ground to a wafer thickness of 200 μm by back grinding. At this stage, p+ isolation region 31 is exposed to the rear surface and spans from the front surface to the rear surface. The rear surface is etched by a thickness of 20 μm using a hydrofluoric acid—nitric acid mixture to make the rear surface smooth. Thickness of the wafer is 180 μm at this stage to form n− drift layer 34 having a predetermined thickness. Then, p+ collector layer 29 is formed in the similar manner as in Example 1. Al/Ti/Ni/Au are sequentially deposited on the collector layer to form collector electrode 35. Finally, dicing is conducted in the scribe region. Thus, reverse blocking IGBT chips are produced.

Isolation region 31 is provided for avoiding exposure to the chip end face of the depletion layer that expands from p+ collector layer 29 and n− drift layer 34 of the FZ wafer when reverse bias voltage is applied to the reverse blocking IGBT, in which electric potential is higher at emitter electrode 28 than at collector electrode 35.

A breakdown withstanding structure is formed in the front surface region between emitter electrode 28 and p+ isolation region 31. P type field limit layer 25 is formed next to emitter electrode 28. Field limit layer 25 is in contact with field limit electrode 27a. Field limit electrode 27a is formed relatively widely beyond field limit layer 25 extending towards the p+ isolation region (in the direction towards periphery of the device). Several pairs of field limit layer 25 and field limit electrode 27 are formed arranged towards isolation region 31. Every field limit electrode is at each floating electric potential. The extending direction of the field limit electrodes in the emitter electrode side is reversed from the extending direction of the field limit electrodes in the isolation region side at intermediate field buffer region 33 disposed at an intermediate portion of the breakdown withstanding structure. Field limit electrode 27b on field limit layers 25 in the region between intermediate field buffer region 33 and isolation region 31 is formed relatively widely beyond the field limit layer and extending in the direction of the emitter electrode side (in the direction towards inner portion of the device), taking reverse bias into account. Several pairs of a field limit layer and such a field limit electrode 27b are formed towards the emitter electrode side. When a depletion layer expands from the emitter electrode side outward, the depletion layer tends to expand by an effect of field limit electrodes 27a that are extending outward. On the other hand, field limit electrodes 27b that are extending inward tend to hinder the expansion of the depletion layer, abruptly changing the effect on the depletion layer. As a result, concentration of electric field occurs at a tip of innermost field limit electrode 27b, leading to avalanche.

To avoid this electric field concentration and for the depletion layer to smoothly expand towards the side of the field limit electrodes that have a protrusion in the reversed direction, intermediate field buffer region 33 is provided for mitigating the electric field concentration.

FIG. 10(b) shows an example without an electrode film like field limit electrode 27. FIG. 10(c) shows an example in which intermediate field buffer region 33 is replaced by field limit layers 25a, 25a and field limit electrodes on the field limit layers are extended and joined together to form electrode 27d. FIG. 10(d) shows an example in which the width of intermediate field buffer region 33 is enlarged and field limit electrodes 27e, 27e extending in opposing directions are provided on the enlarged intermediate field buffer region.

The outermost field limit electrode in contact with p+ isolation region 31 is equivalent to a channel stopper electrode disposed in a peripheral portion of an usual IGBT in the forward blocking condition, and thus, called a channel stopper electrode in this specification, too.

FIGS. 11(a) and (b) are sectional views of the breakdown withstanding structure illustrating development of a depletion layer in a forward biased condition (FIG. 11(a)) and a reverse biased condition (FIG. 11(b)). As shown by a dotted line and an arrow in FIG. 11(a) for the forward biased condition, when an applied voltage is about one tenth of a breakdown voltage, depletion layer 36 expands from emitter electrode 28 towards isolation region 31 up to around the middle position of the breakdown withstanding structure. In this stage, the extension of field limit electrode 27a is in a direction to assist expansion of the depletion layer. Thus, electric field intensity neighboring the pn junction of field limit layer 25 is mitigated. As the applied forward bias voltage increases, the depletion layer expands beyond intermediate field buffer region 33 around middle position of the breakdown withstanding structure towards isolation region 31. In this stage, the extension of field limit electrode 27b is in a direction to hinder expansion of the depletion layer. Thus, with increase of applied voltage, development of the front of depletion layer 36 slows down and finally stops before reaching isolation region 31.

In a reverse biased condition, as shown by a dotted line and an arrow in FIG. 11(b), when an applied voltage is about one tenth of a breakdown voltage, depletion layer 36 expands from isolation region 31 towards emitter electrode 28 up to around the middle position of the breakdown withstanding structure. In this stage, the extension of field limit electrode 27b is in a direction to assist expansion of the depletion layer. Thus, electric field intensity neighboring the pn junction of field limit layer 25 in the isolation region side of the breakdown withstanding structure is mitigated. As the applied reverse voltage increases, the depletion layer expands beyond the intermediate portion of the breakdown withstanding structure towards emitter electrode 28. In this stage, the extension of field limit electrode 27a is in a direction to hinder expansion of the depletion layer. Thus, with increase of applied voltage, development of the front of depletion layer 36 slows down and finally stops before reaching the active region.

In a reverse biased condition, however, the depletion layer develops not only laterally from isolation region 31, but also vertically from the rear surface side. As described previously, as the applied voltage approaches a breakdown voltage, the n− drift layer tends to lack electric charges (electrons) for forming a depletion layer, further promoting expansion of depletion layer 36. Therefore, it becomes important to design adequate distance between field limit electrodes 27 and distance between field limit layers 25. The design of the distance is described below.

If a distance between the field limit layers is narrower than a width of a built-in depletion layer that expands from the field limit layer to the n− drift layer in a condition of equipotential between the emitter electrode and the collector electrode, there is no non-depleted neutral region between the field limit layers. If the distance between the field limit layers around the front of the depletion layer is narrow at relatively high reverse biased applied voltage, the depletion layers joins together and reaches the emitter layer, which is a reach-through state and causes increase in leakage current.

Figure 12A:
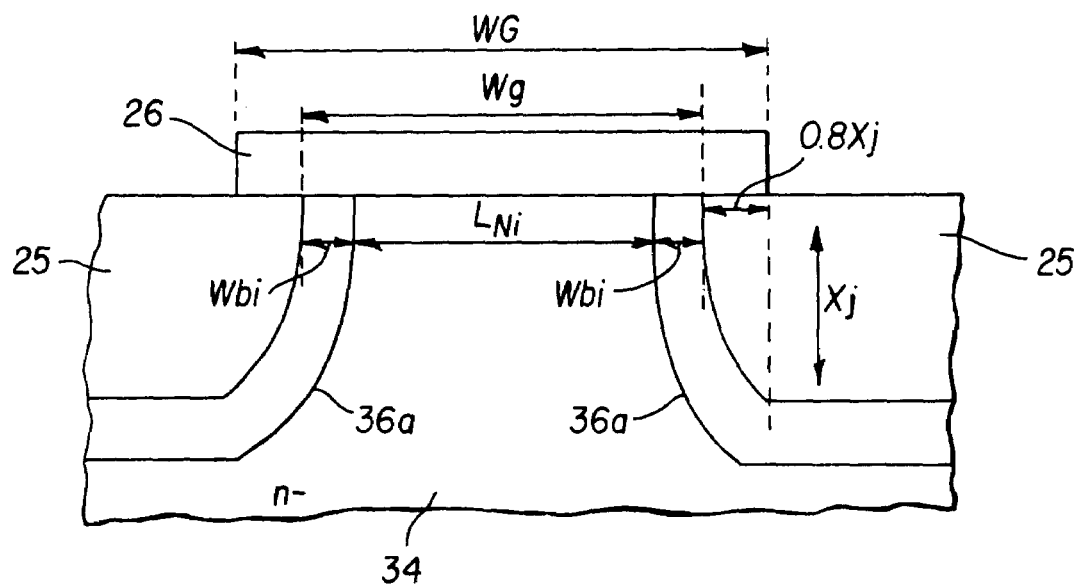
FIGS. 12(a) and (b) are partial sectional views showing expansion of a depletion layer between the field limit layers.
Figure 12B:
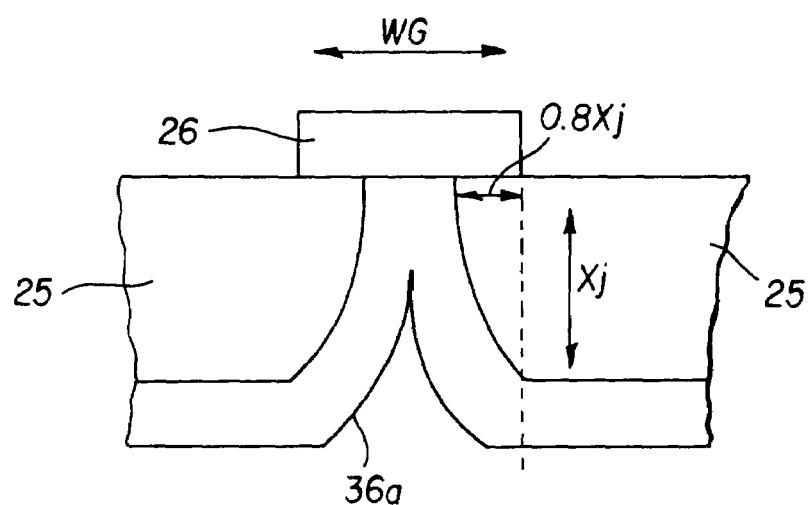
FIG. 12(b) shows a case the width WG is narrow.

FIGS. 12(a) and (b) illustrate this circumstance. FIGS. 12(a) and (b) are partial sectional views showing expansion of a depletion layer between the field limit layers. FIG. 12(a) shows a case in which a width WG of the oxide film is wide, and FIG. 12(b) shows a case in which the width is narrow. In FIGS. 12(a) and (b), symbol 25 indicates a field limit layer, 26, an oxide film, 34, an n− drift layer, and 36a, a depletion layer. When p type field limit layer 25 is formed by boron ion implantation using a mask of oxide film 26 having a width of WG and followed by thermal diffusion to a diffusion depth of Xj, lateral diffusion proceeds to a distance 0.8 Xj from the end of oxide film 26. Therefore, the distance between the field limit layers is preferably wider than or equal to the sum of 1.6 Xj=0.8 Xj+0.8 Xj and 2 Wbi=Wbi+Wbi, Wbi being a width of a built-in depletion layer at zero applied voltage. Formula (18) represents this condition.

$$W_G > 1.6\ Xj + 2\ Wbi \qquad \text{Formula (18),}$$

where $W_G$ is the width of an oxide film between field limit layers,

Xj is the diffusion depth of the field limit layer, and

Wbi is the width of a built-in depletion layer developing from the field limit layer into n– drift layer in a condition of equipotential between the emitter electrode and the collector electrode.

FIG. 12(*a*) shows the case $W_G > 1.6\ Xj + 2\ Wbi$, and FIG. 12(*b*) shows the case $W_G < 1.6\ Xj + 2\ Wbi$. The situation can be defined in terms of another parameter Wg, a distance between the field limit layer; namely Wg > 2 Wbi.

Figure 13:
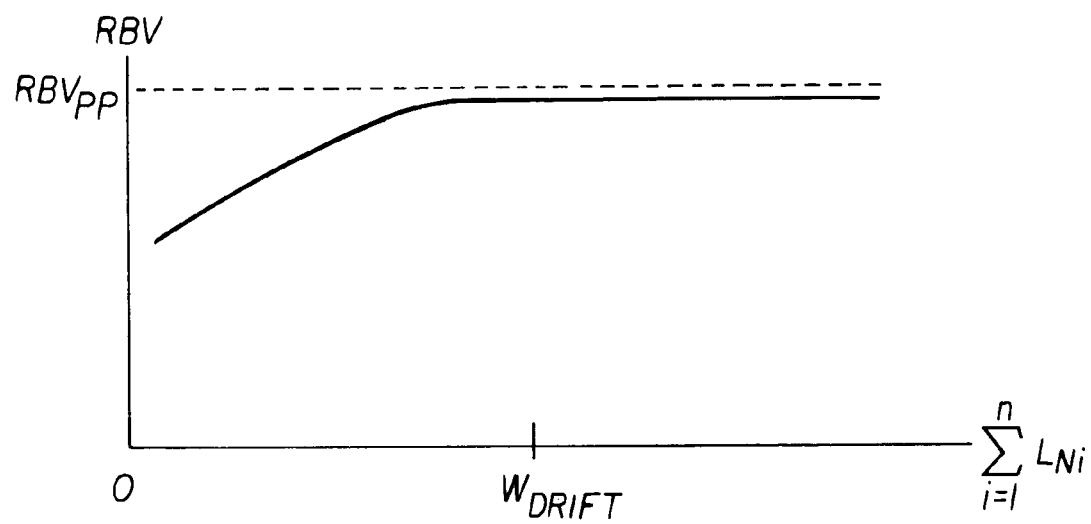
FIG. 13 is a characteristic chart illustrating relationship between reverse breakdown voltage and a sum of distances LNi that is a width of a neutral region between the field limit layers at a zero bias condition shown in FIG. 11.

FIG. 13 is a characteristic chart illustrating relationship between reverse breakdown voltage and a sum of distances $L_{Ni}$ that is a width of a neutral region (without joining of built-in depletion layers) between the field limit layers at a zero bias condition. Here, $$L_{Ni} = W_G i - (1.6\ Xj + 2\ Wbi),$$

where i is an order number of the field limit layer, and $W_G i$ is width of an insulator film of oxide between (i–1)-th and i-th field limit layer.

It has been discovered that the reverse breakdown voltage rapidly decreases from an ideal reverse breakdown voltage of a planar junction when the sum becomes smaller than the n– drift layer thickness $W_{drift}$. As described above, it is important that built-in depletion layers are not joined together between the field limit layers, so that a neutral region $L_{Ni}$ remains. As applied voltage increases, the neutral region gradually changes to a depletion layer, and at the same time, a depletion layer expands vertically under the active region from a pn junction in the rear surface side towards the front surface side. If the sum of the neutral regions in the breakdown withstanding structure in a zero bias condition is smaller than the n– drift layer thickness in the vertical direction, a depletion layer in the breakdown withstanding structure reaches the emitter electrode at an applied voltage lower than a voltage at which a vertically expanding depletion layer reaches the emitter electrode, that is, reach-through occurs and a breakdown voltage decreases. Therefore, the condition of the following Formula (19) is preferable.

$$\sum_{i=1}^{n} L_{Ni} \geq W_{drift} \qquad \text{Formula (19)}$$

where $$\sum_{i=1}^{n} L_{Ni}$$

is the sum of the width of the neutral region at zero bias in the breakdown withstanding structure and $$L_{Ni} = W_{Gi} - (1.6 X_j + 2 W_{bi})$$

where i is an order number of the field limit layer, $W_G i$ is the width of an insulator film of oxide between (i–1)-th and i-th field limit layer, and n is the total number of the field limit layers.

EXAMPLE 4

Figure 14:
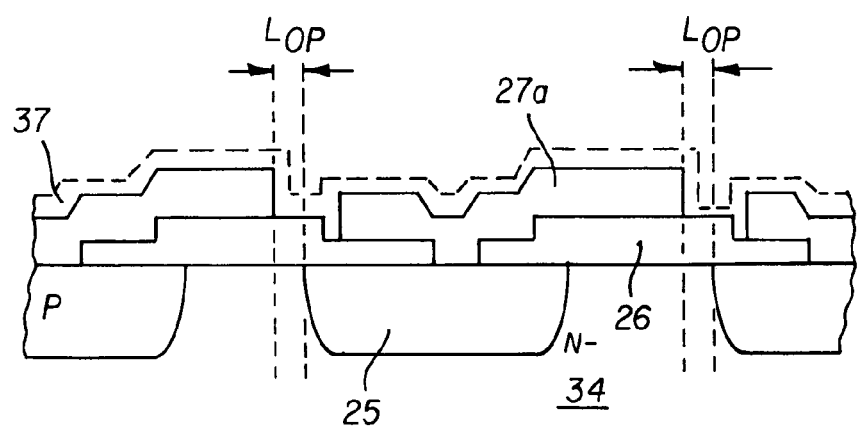
FIG. 14 is a partial sectional view showing a width Lop of an opening between a field limit electrode 27a and an adjacent field limit layer 25.

FIG. 14 is a partial sectional view showing a width Lop of an opening between field limit electrode 27a and adjacent field limit layer 25. Passivation layer 37 is provided on the surface of the device. In a humid environment, negative ions eventually invade into a portion without field limit electrode 27a of a surface region of oxide film 26. The invasion of the negative ions induces positive charges on drift layer 34 beneath oxide film 26, generating inhomogeneity of potential distribution and decreasing breakdown voltage. Accordingly, a simulation has been made considering the invasion of negative ions with varied width Lop of the opening. The results are given in Table 1.

TABLE 1

| | | Σ | | | edge | FBV [V] | | RBV [V] | |
|---|---|---|---|---|---|---|---|---|---|
| | | | | | | 0 | $-10^{12}/cm^2 \times q$ (elementary charge of electron) | 0 | $-10^{12}/cm^2 \times q$ (elementary charge of electron) |
| sample number | $W_{Gi}$ [μm] | $L_{Ni}$ [μm] | $L_{OP}$ [μm] | $\Sigma L_{OP}/\Sigma L_{Ni}$ | length [μm] | | | | |
| sample 1 | 354 | 237 | 200.2 | 0.845 | 552 | 1402 | 806 | 1312 | 871 |
| sample 2 | 390 | 273 | 205.0 | 0.751 | 567 | 1426 | 981 | 1321 | 1022 |
| sample 3 | 765 | 290 | 177.6 | 0.612 | 1302 | 1450 | 1433 | 1356 | 1317 |
| sample 4 | 554 | 284 | 111.0 | 0.391 | 884 | 1447 | 1360 | 1334 | 1308 |
| sample 5 | 509 | 275 | 96.2 | 0.350 | 793 | 1435 | 1305 | 1308 | 1296 |

Table 1 shows the result of the simulation for a 1,200 V reverse blocking IGBT. The simulation estimates forward breakdown voltage FBV and reverse breakdown voltage RBV for varied dimensions in the breakdown withstanding structure. In Table 1, $\Sigma W_G i$ is a sum of the widths $W_G i$ of oxide film 26, $\Sigma L_{Ni}$ is a sum of widths $L_{Ni}$ of the neutral regions in the breakdown withstanding structure in a zero bias condition, $\Sigma$ Lop is a sum of distances of openings Lop between an end of a field limit electrode and an end of an adjacent field limit layer, and the edge length is a total length of the breakdown withstanding structure that is a distance from the inner end of the innermost oxide film to the outer end of the outermost oxide film. $\Sigma$ Lop/$\Sigma$ $L_{Ni}$ is an opening proportion of the field limit electrodes with respect to total widths of neutral regions. The simulation showed that forward breakdown voltage and reverse breakdown voltage for every sample are higher than 1,300 V, as shown in columns indicated with "0" for FBV and RBV in Table 1. On the other hand, a simulation assuming existence of negative charges with a density of $1\times10^{12}$/cm$^2$ on the neutral regions having width of $L_{Ni}$ has demonstrated substantial decrease in both forward and reverse breakdown voltages for Samples 1 and 2. Therefore, $\Sigma$ Lop/$\Sigma$ $L_{Ni}$ is preferably less than 0.7.

Figure 15A:
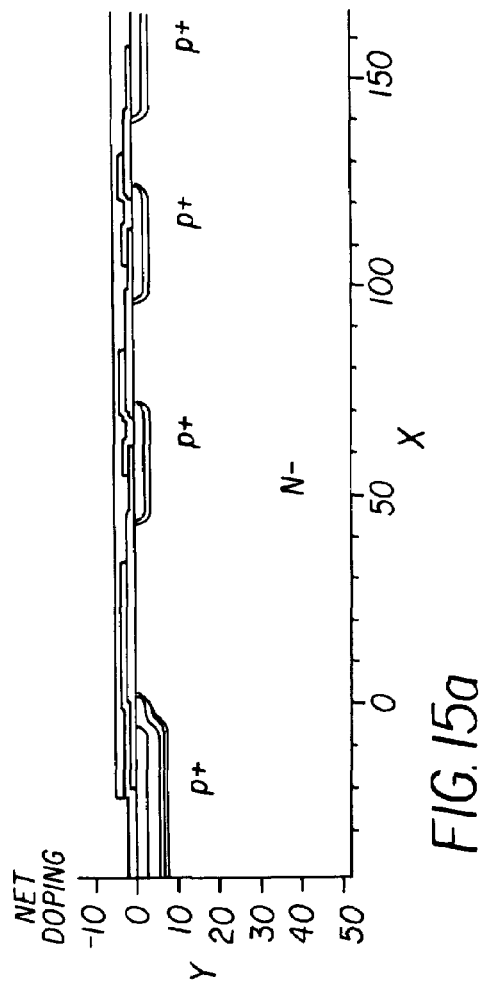
FIGS. 15(a) through (d) are schematic partial sectional views of a comparative example illustrating reach-through of a depletion layer to a principal pn junction in the emitter side.
Figure 15B:
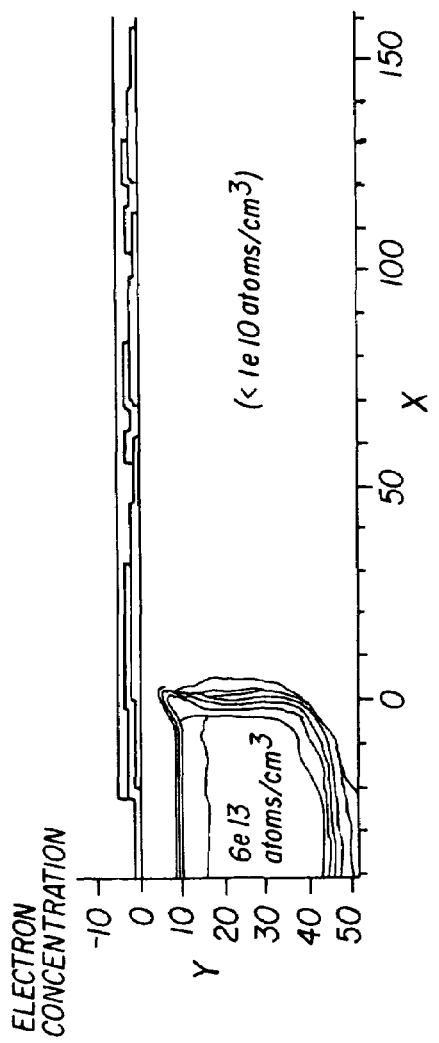
Figure 15C:
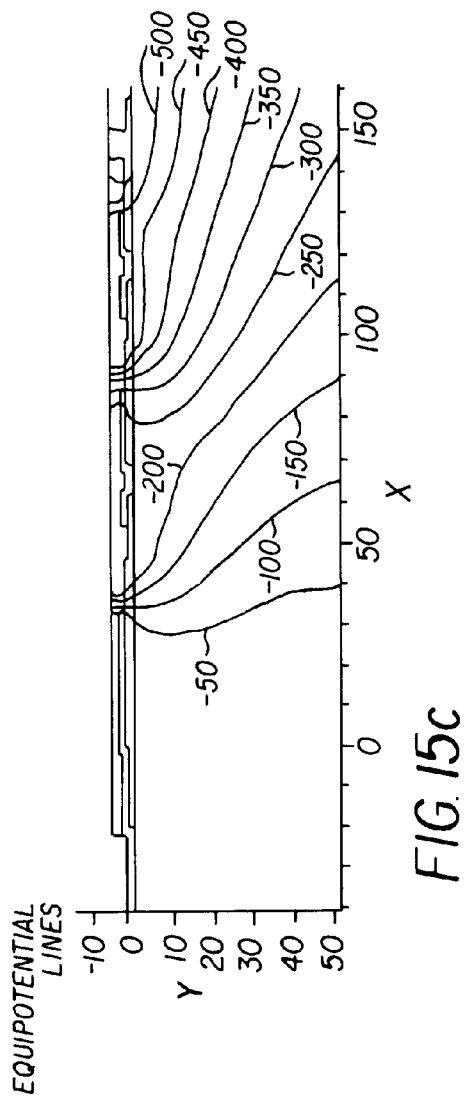
Figure 15D:
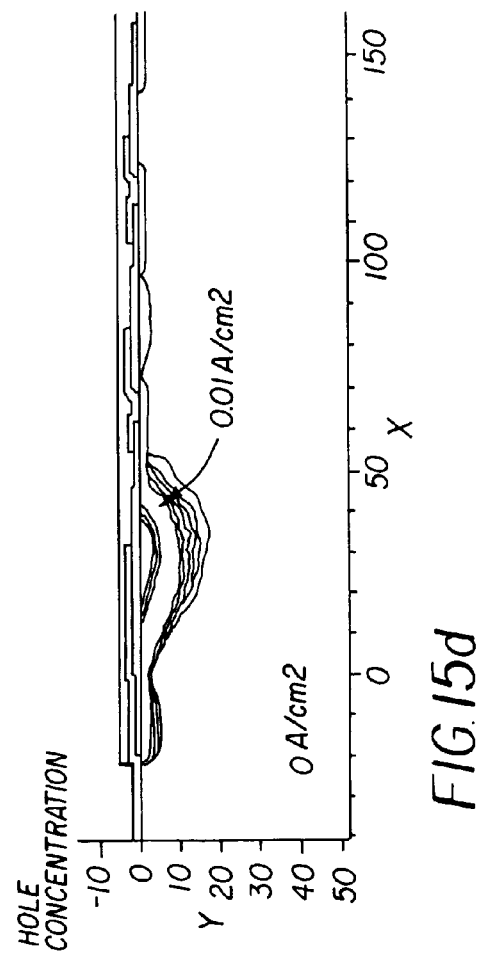

FIGS. 15(a) through (d) are schematic partial sectional views of a comparative example illustrating reach-through of a depletion layer to a principal pn junction in the emitter side when the emitter-collector voltage is RBV 871V for the sample in Table 1. FIG. 15(a) shows net doping, FIG. 15(b) shows electron concentration, FIG. 15(c) shows equipotential lines, and FIG. 15(d) shows hole current density. In FIGS. 15(a) through (d), an outer end region of the emitter electrode is shown in the left side of the figures. The figures only show a portion near the emitter electrode, and do not show a portion near the isolation region. As shown with electron concentration in FIG. 15(b), the charge neutral zone in which the electron concentration is approximately $6\times10^{13}$/cm$^3$ does not exist in the right-hand side of the P emitter layer whose x-coordinate is 5 μm or more but under P emitter layer whose x-coordinate is from −40 to 0 μm. This means the depletion layer is in a reach-through state to the principal pn junction in the front surface of the emitter side. As shown with hole current density in FIG. 15(d), reverse leakage current flows in the portion of planar termination edge structure. The circumstances shown in FIGS. 15(a) through (d) correspond to Sample 1 in Table 1.

FIG. 16(a) through (d) correspond to Samples 3 through 5, and are schematic partial sectional views of the breakdown withstanding structure region with an opening width Lop of 7 μm. FIGS. 16(a), (b), (c), and (d) show net doping, electron concentration, equipotential lines, and hole current density, respectively. FIGS. 16(a) through (d), like FIGS. 15(a) through (d), show only a portion near the emitter electrode, and do not show a portion near the isolation region. As shown with electron concentration in FIG. 16(b), the depletion layer is remote laterally from the principal pn junction in the emitter side with enough distance. As shown with the hole current density in FIG. 16(d), the leakage current flows vertically in the active region under the emitter electrode, demonstrating a stable characteristic.

EXAMPLE 5

FIGS. 17 through 23 illustrate Example 5, in which n type high concentration layers 38 are provided in the breakdown withstanding structure region. Impurity concentration in the high concentration layers is higher than in the n− drift layer and lower than in the n+ emitter region. The n type high concentration layers further prevent a depletion layer from expansion in a reverse bias condition. The high concentration layer can be formed, for example, by phosphor ion implantation around the neutral regions in the breakdown withstanding structure with a dose of $1\times10^{12}$/cm$^2$ and an acceleration voltage of 45 keV, followed by driving-in at 1,150° C. for 5 hours.

Figure 17A:
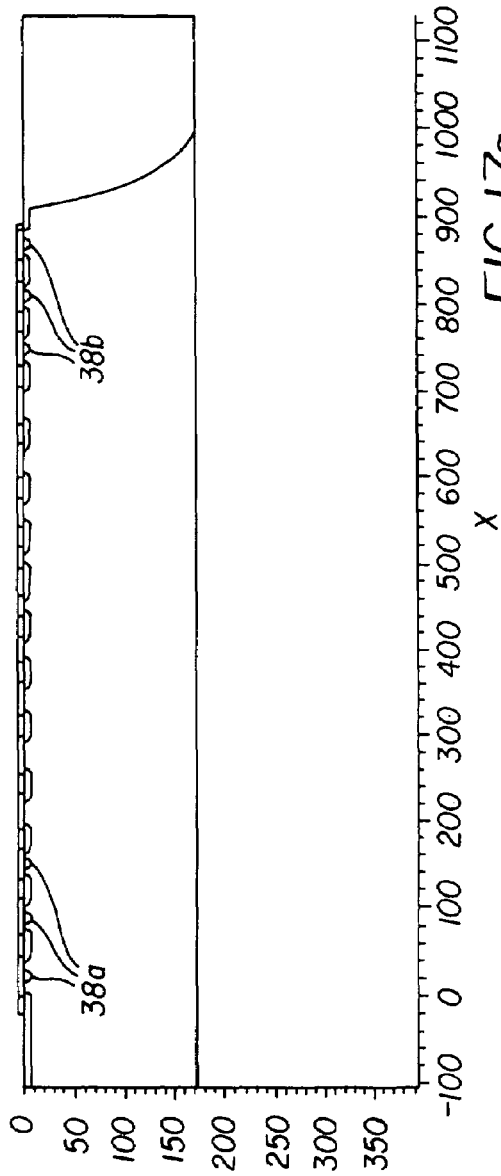
FIGS. 17(a) and (b) are sectional views of an example of embodiment in which the n type high concentration layers are formed in both the emitter electrode side and the isolation region side in the breakdown withstanding structure region.
Figure 17B:
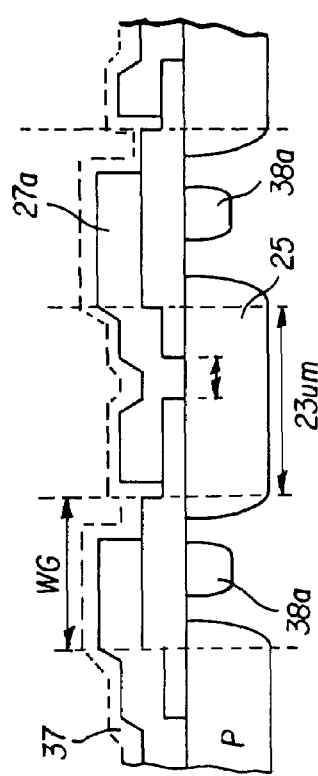
FIG. 17(b) shows a partially enlarged section of the emitter electrode side.

FIGS. 17(a) and (b) are sectional views of an example of embodiment in which the n type high concentration layers are formed in both the emitter electrode side and the isolation region side in the breakdown withstanding structure region. FIG. 17(a) shows a cross section of the breakdown withstanding structure region, and FIG. 17(b) shows a partially enlarged section of the emitter electrode side. In this example, three high concentration layers 38a are formed in the emitter electrode side (one between the principal emitter pn junction and first field limit layer 25, and two outside the first field limit layer); and three high concentration layers 38b are formed in the isolation region side (one between the isolation region and the outermost field limit layer 25, and two inside the outermost field limit layer). The high concentration layers are formed without overlapping with a field limit layer. The high concentration layers 38a, 38b enhance reverse breakdown voltage, reduce reverse bias leakage current, and control decrease in forward breakdown voltage within about 5%. Symbol 37 indicates a passivation layer for protecting the surface of the device. The n type high concentration layers may be formed every space between the field limit layers.

Figure 18:
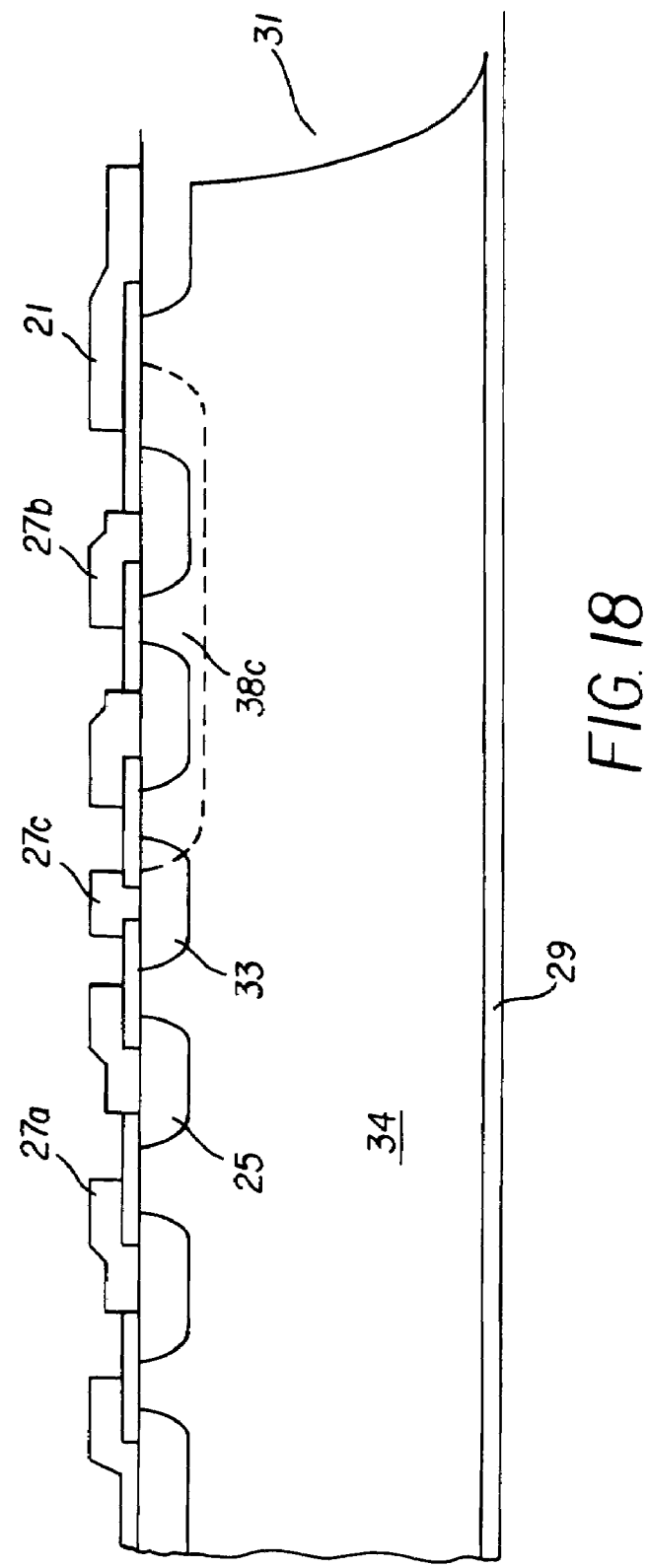
FIG. 18 is a schematic sectional view of the breakdown withstanding structure region of an example of embodiment in which an n type high concentration layer is formed in the isolation region side of the breakdown withstanding structure region.
Figure 19:
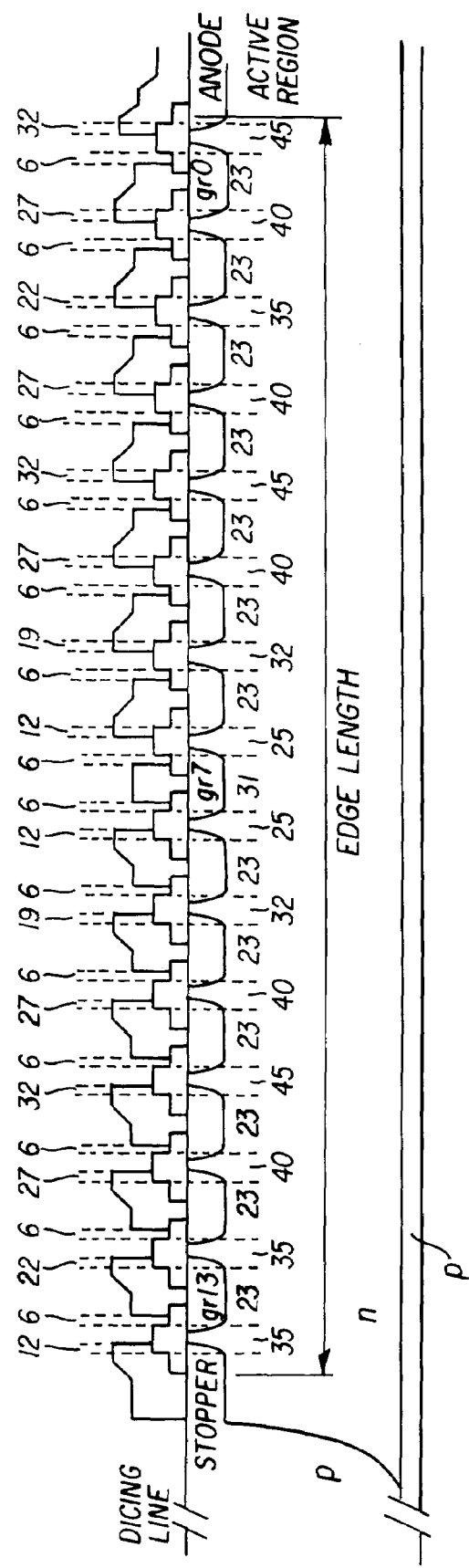
FIG. 19 is a detailed sectional view of the breakdown withstanding structure region before forming n type high concentration layers.
Figure 20C:
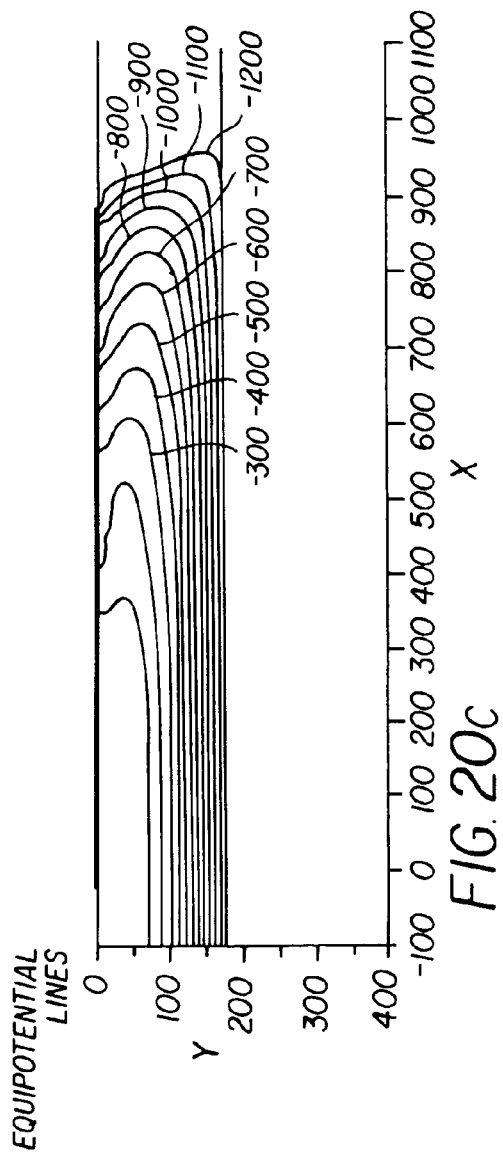
Figure 20D:
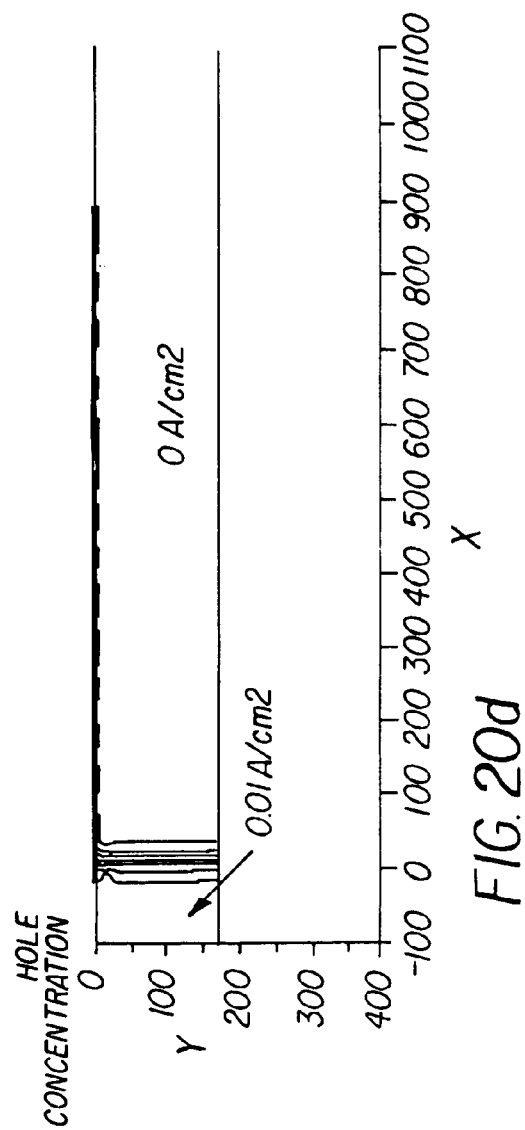

FIGS. 18 through 20 are sectional views of an example of embodiment in which an n type high concentration layer is formed in the isolation region side of the breakdown withstanding structure region. FIG. 18 is a schematic sectional view of the breakdown withstanding structure region. FIG. 19 is a detailed sectional view of the breakdown withstanding structure region before forming the n type high concentration layers. The numerical values between the dotted lines in FIG. 19 correspond to the width between the dotted lines in the illustrated embodiment. The numerical value is given in μm and "gr0", "gr7" and "gr13" are the numbers of guard rings, which are numbered from the side of the active region to the side of the dicing line. FIG. 20 shows schematically a partial cross section of the breakdown withstanding structure region. FIGS. 20(a) through (d) illustrate net doping, electron concentration, equipotential lines, and hole current density, respectively. FIG. 19 only is drawn reversed in left and right sides, namely, active region in the right side and isolation region in the left side of the figure. As shown in FIG. 18, n type high concentration layer 38c is formed in a region spanning from a place under channel stopper electrode 21 in contact with the isolation region to intermediate field buffer region 33. High concentration layer 38c suppresses expansion of a depletion layer in a reverse bias condition in a voltage range of zero to half the breakdown voltage (up to about 600 V). As a result, reach-through of depletion layer to an emitter principal junction is suppressed in comparison with a structure without high concentration layer 38c, and reverse breakdown voltage is enhanced by 100 V from 1,250 V to 1,350 V. Forward breakdown voltage is not affected because a depletion layer in the process of expansion encounters no high concentration layer like 38c in the side of the emitter principal junction.

Figure 21:
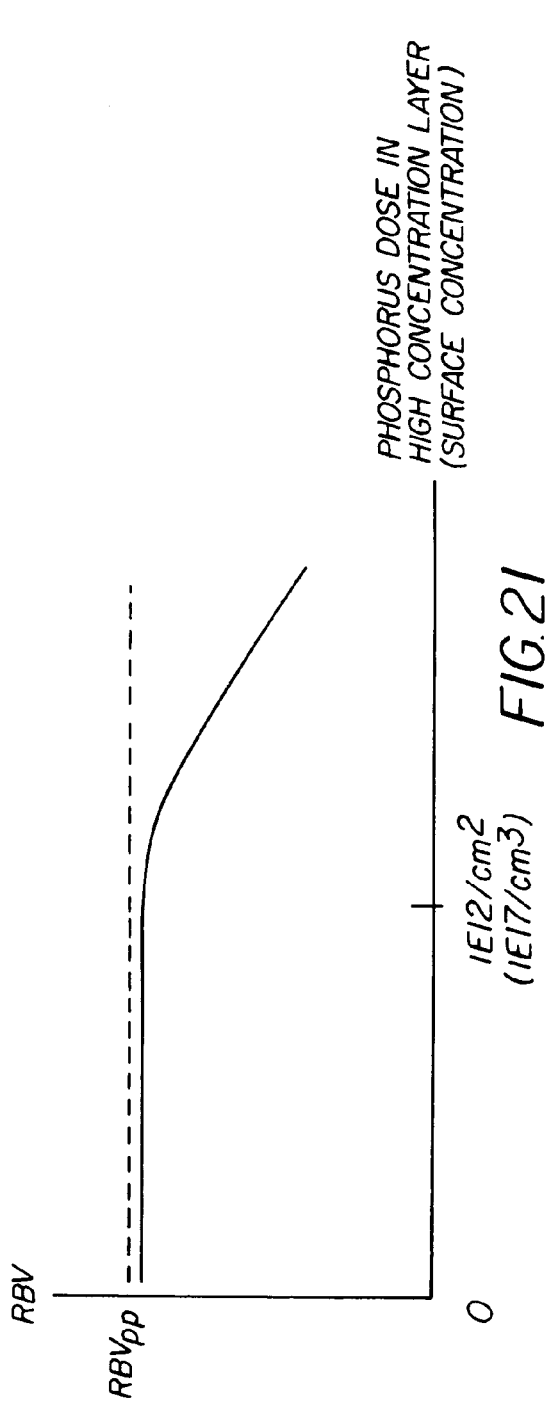
FIG. 21 shows dependence of reverse breakdown voltage on phosphor dose to the high concentration layer of the structure of FIG. 18.

FIG. 21 shows dependence of reverse breakdown voltage on phosphor dose to the high concentration layer of the structure of FIG. 18. Concentration at the surface corresponding to the dose is also written. A dose of more than $1\times10^{12}$ atoms/cm$^2$ (or a surface concentration of more than $1\times10^{17}$ atoms/cm$^3$) deteriorates reverse breakdown voltage. The reason for this deterioration is excessive suppression to the depletion layer in a reverse bias condition, which causes high electric field intensity in the portion of the high concentration layer and the p type field limit layers. Therefore, a phosphor dose is preferably less than $1\times10^{12}$ atoms/cm$^2$, which corresponds to a surface concentration of $1\times10^{17}$ atoms/cm$^3$.

Figure 22:
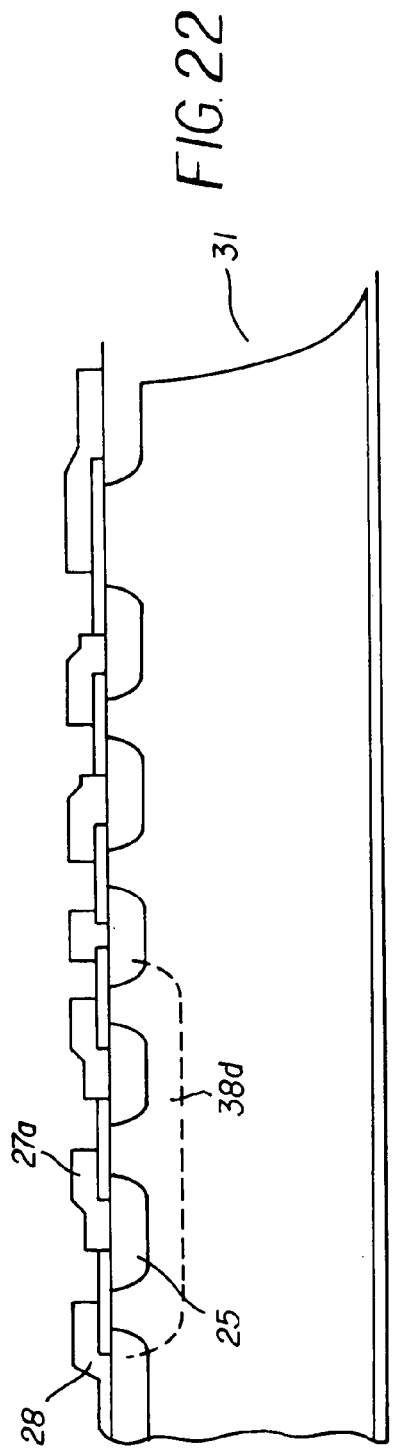
FIG. 22 is a partial sectional view of a breakdown withstanding structure illustrating an n type high concentration layer formed in the emitter electrode side that is about half of the breakdown withstanding structure region.

A similar effect can be obtained by an n type high concentration layer 38d formed in about half the emitter electrode side of the breakdown withstanding structure region as shown in FIG. 22. High concentration layer 38d is formed by phosphor ion implantation with a dose of less than $1\times10^{12}$ atoms/cm$^2$. The present invention provides a breakdown withstanding structure that avoids reach-through of a depletion layer even in a reverse bias condition. As shown by these examples, a place to form the high concentration layer is determined depending on selection of higher breakdown voltage from forward and reverse breakdown voltages.

Figure 23:
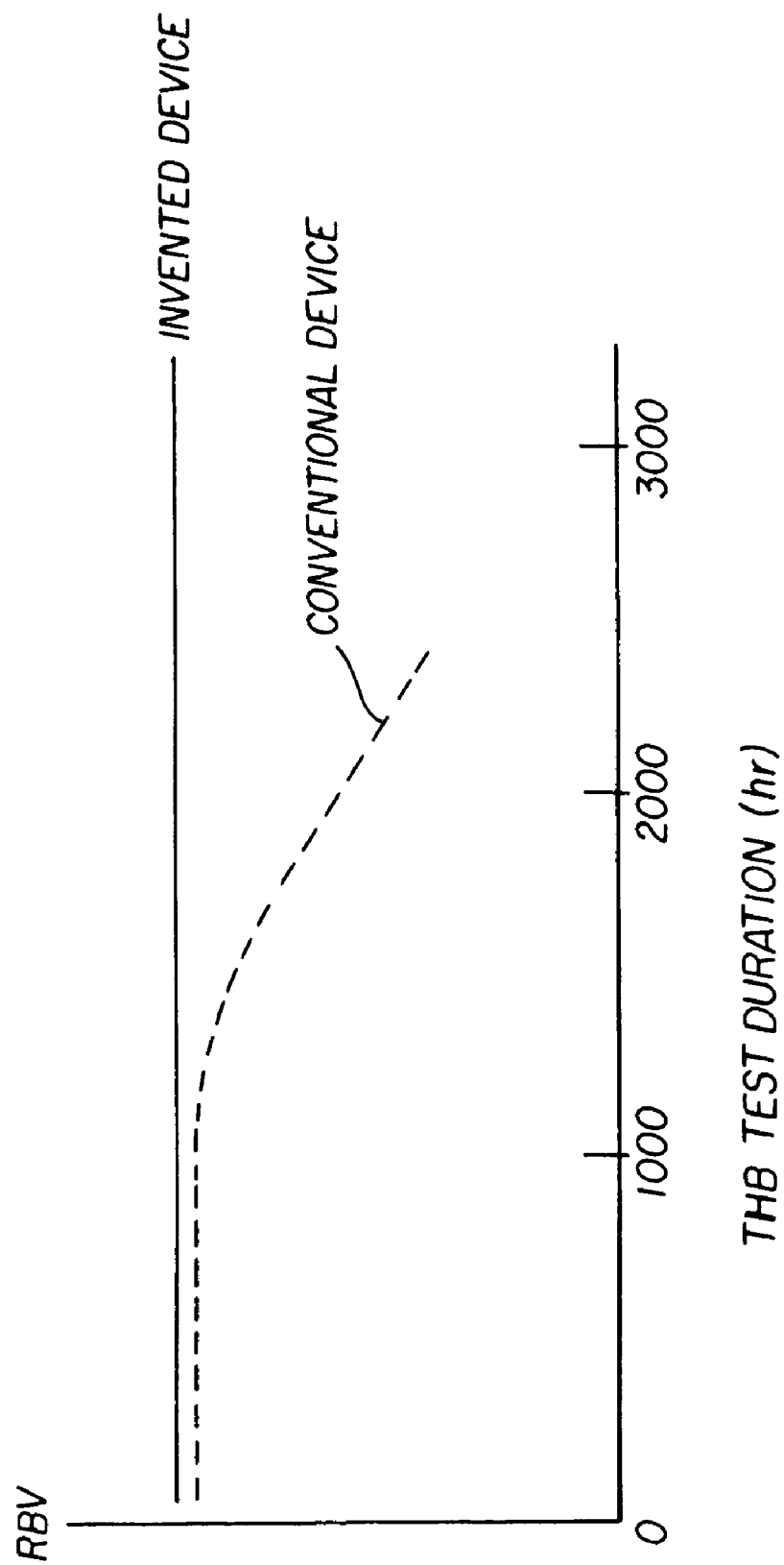
FIG. 23 is a characteristic chart showing variation of reverse breakdown voltage in a long term in a THB test.
Figure 24A:
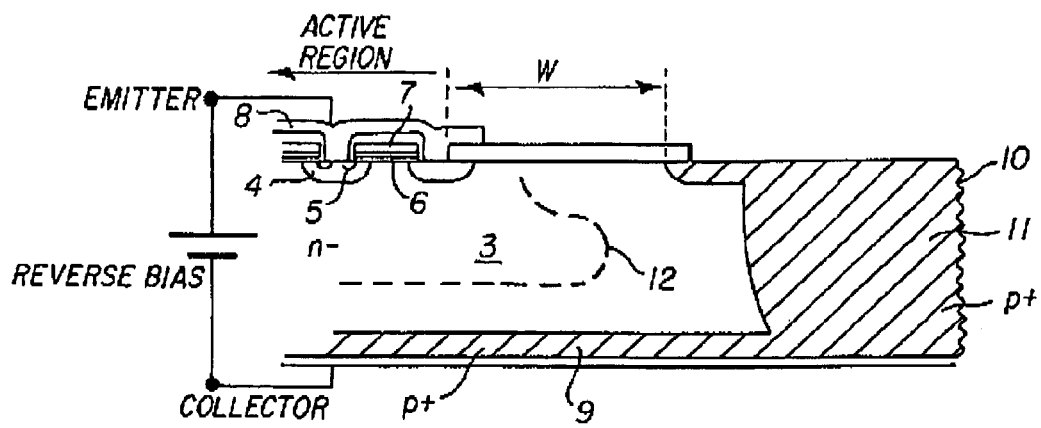
FIGS. 24(a) and (b) are sectional views of an essential part of a conventional reverse blocking IGBT.
Figure 24B:
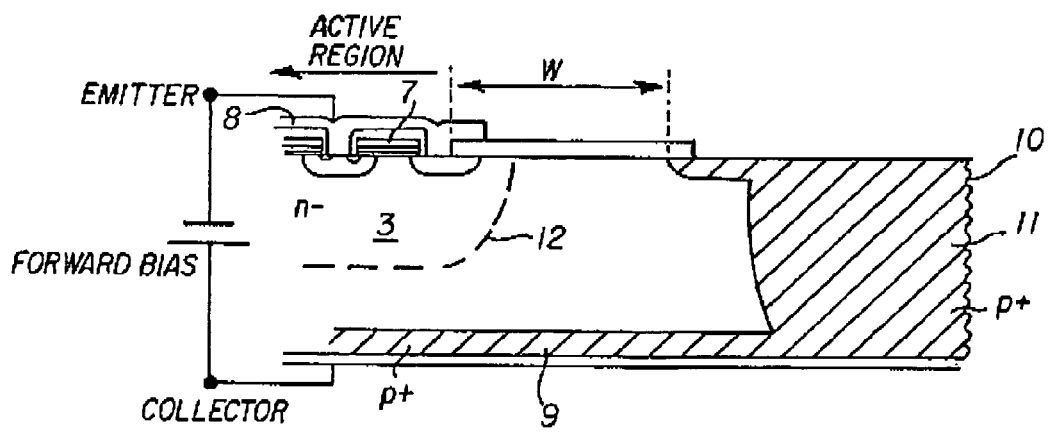
Figure 25A:
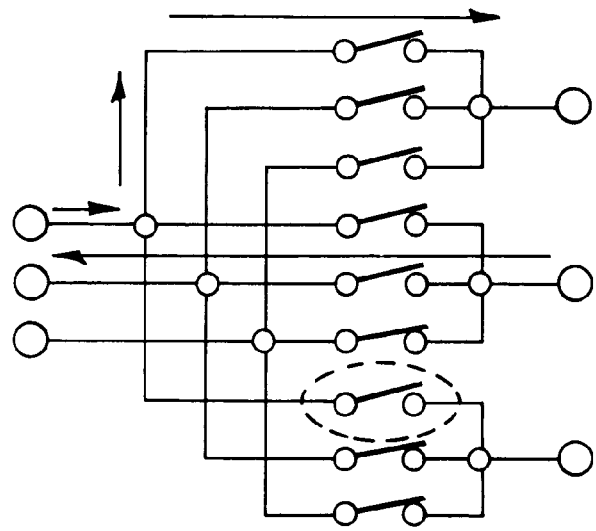
FIGS. 25(a), (b), and (c) show a matrix converter circuit.
Figure 25B:
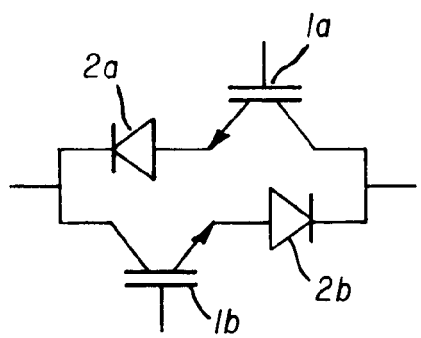
Figure 25C:
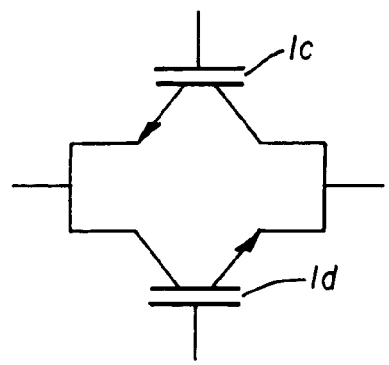
Figure 26:
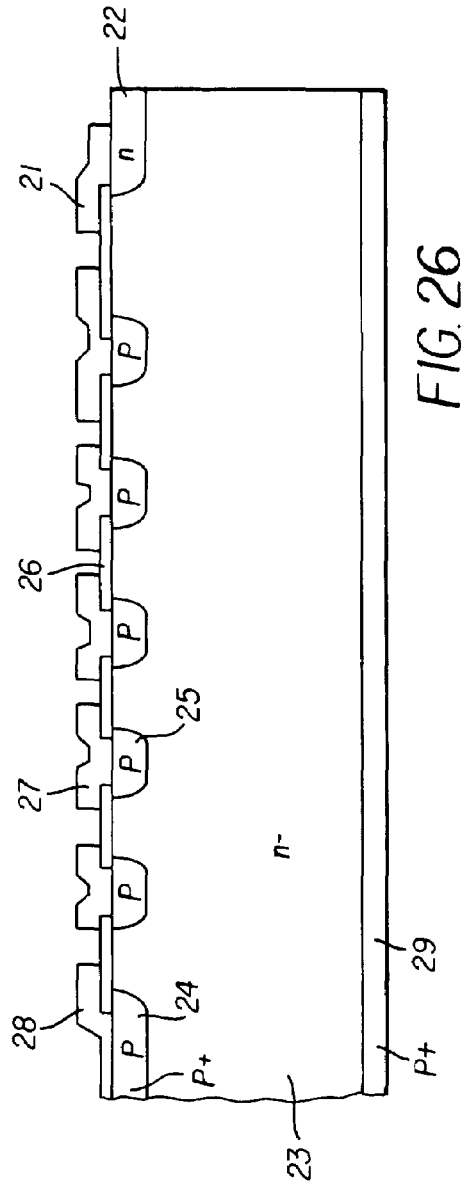
FIG. 26 is a sectional view illustrating a peripheral breakdown withstanding structure of a conventional IGBT.
Figure 27:
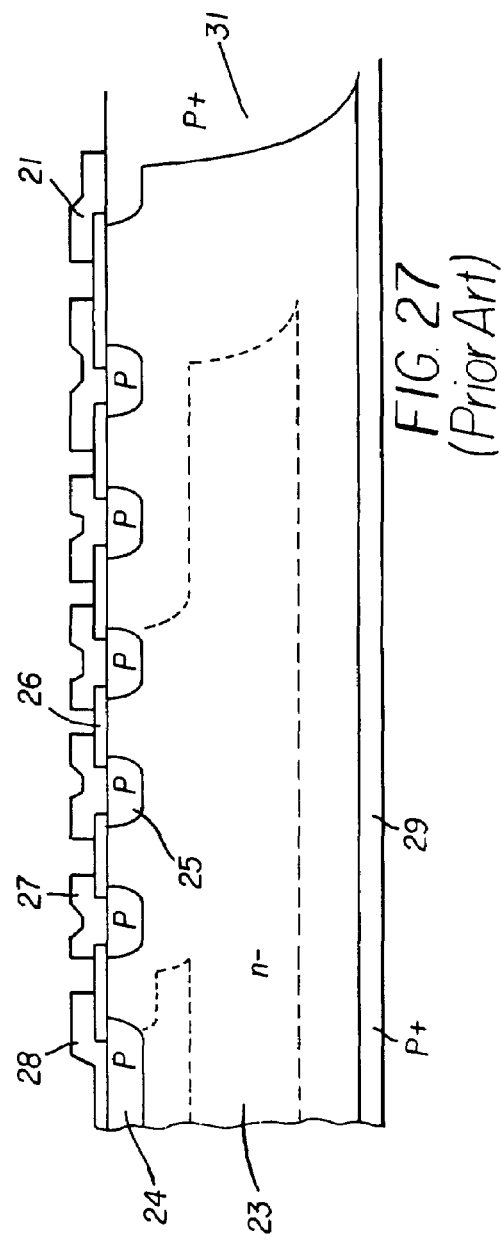
FIG. 27 is a sectional view illustrating a peripheral breakdown withstanding structure of a conventional IGBT.

FIG. 23 is a characteristic chart showing variation of reverse breakdown voltage in a long term in a THB test (temperature humidity biased test). In the THB test, reverse blocking IGBT chips are mounted in a two-in-one module, in which two chips are series-connected to form one module. A reverse bias voltage of 960 V is applied to the module with higher voltage at an emitter electrode than at a collector electrode of a lower arm IGBT chip. The module is placed in an environment of 85% RH and 125° C. A conventional device having a breakdown withstanding structure of a resistive film begins to decrease breakdown voltage at 1,000 hours. In contrast, a device of the invention demonstrates stable reverse breakdown voltage after over 3,000 hours, even at 5,000 hours. The present invention provides a breakdown withstanding structure to demonstrate stable reverse blocking capability in long term reliability test. The present invention thus provides a reverse blocking IGBT that enables a matrix converter without a series-connected diode.

A reverse blocking semiconductor and a method for its manufacture have been described according to the present invention. Many modifications and variations may be made to the techniques and structures described and illustrated herein without departing from the spirit and scope of the invention. Accordingly, it should be understood that the methods and devices described herein are illustrative only and are not limiting upon the scope of the invention.

What is claimed is:

1. A reverse blocking semiconductor device comprising:
a drift layer of a first conductivity type:
a MOS gate structure including a base layer of a second conductivity type selectively formed in a front surface region of the drift layer, an emitter region of the first conductivity type selectively formed in a surface region of the base layer, a gate insulation film covering a surface area of the base layer between the emitter region and the drift layer, and a gate electrode formed on the gate insulation film;
an emitter electrode in contact with both the emitter region and the base layer of the MOS gate structure;
an isolation region of the second conductivity type surrounding the MOS gate structure through the drift layer and extending across an entire thickness of the drift layer;
a collector layer of the second conductivity type formed on a rear surface of the drift layer and connecting to a rear side of the isolation region; and
a collector electrode in contact with the collector layer;
wherein a distance W is greater than a thickness d, in which the distance W is a distance from an outermost position of an portion of the emitter electrode, the portion being in contact with the base layer, to an innermost position of the isolation region, and the thickness d is a dimension in a depth direction of the drift layer.

2. The reverse blocking semiconductor device according to claim 1, wherein lattice defects are introduced at least in the base layer.

3. The reverse blocking semiconductor device according to claim 1, wherein defects are introduced homogeneously to the entire front surface of the semiconductor device to reduce the lifetime of minority carriers in the semiconductor device.

4. A reverse blocking semiconductor device according to claim 1, wherein the impurity concentration of the collector layer is smaller than that of the isolation region.

5. A reverse blocking semiconductor device according to claim 1, wherein the impurity concentration of the collector layer is of the order of $10^{17}$ cm$^{-3}$ and the impurity concentration of the isolation region is of the order of $10^{19}$ cm$^{-3}$.

6. A reverse blocking semiconductor device according to claim 1, wherein an ambipolar diffusion length La is less than W.

* * * * *